US012738934B2

United States Patent
(12) United States Patent
King et al.

(10) Patent No.: US 12,738,934 B2
(45) Date of Patent: Sep. 15, 2026

(54) SWITCHING DRIVERS

(71) Applicant: Cirrus Logic International Semiconductor Ltd., Edinburgh (GB)

(72) Inventors: Eric J. King, Austin, TX (US); John L. Melanson, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 135 days.

(21) Appl. No.: 18/899,649

(22) Filed: Sep. 27, 2024

(65) Prior Publication Data

US 2025/0373244 A1 Dec. 4, 2025

Related U.S. Application Data

(60) Provisional application No. 63/655,213, filed on Jun. 3, 2024.

(51) Int. Cl.
*H03K 17/56* (2006.01)
*H04R 3/00* (2006.01)

(52) U.S. Cl.
CPC ............... *H03K 17/56* (2013.01); *H04R 3/00* (2013.01)

(58) Field of Classification Search
CPC .................................. H03K 17/56; H04R 3/00
USPC ......................... 327/108, 109, 110, 403, 404
See application file for complete search history.

(56) References Cited

U.S. PATENT DOCUMENTS 9,806,682 B1 * 10/2017 Marcone ................ H03F 3/185
12,021,491 B2 6/2024 Mallinson
2002/0041246 A1 * 4/2002 Chang .................. H03M 1/822 341/152
2013/0223651 A1 * 8/2013 Hoyerby ................ H03F 3/187 381/120
2014/0063885 A1 * 3/2014 Itoh ...................... H02M 7/483 363/132
2015/0288335 A1 * 10/2015 Høyerby .............. H03F 1/0205 330/251
2016/0336872 A1 11/2016 Cheng et al.
2023/0344394 A1 * 10/2023 Melanson ............ H03F 3/2175
2024/0421783 A1 * 12/2024 Zhang ................... H03F 1/0244
2025/0088151 A1 * 3/2025 Petersen .............. H02M 3/072

(Continued)

FOREIGN PATENT DOCUMENTS

CN 117242688 A 12/2023

OTHER PUBLICATIONS

International Search Report and Written Opinion of the International Searching Authority, International Application No. PCT/GB2025/051185, mailed Aug. 8, 2025.

(Continued)

*Primary Examiner* — William Hernandez
(74) *Attorney, Agent, or Firm* — Jackson Walker L.L.P.

(57) ABSTRACT

This application relates to methods and apparatus for controlling a switching driver to drive a load with a drive signal based on an input signal. A controller is configured to control modulation of at least one driver output node between selected switching voltages of a set of at least four different switching voltages to generate the drive signal. The output node is modulated according to a switching pattern and the controller is configured such that, for a given level of drive signal, the controller can selectively operate with a plurality of different switching patterns and selects an appropriate switching pattern to control at least one parameter of the switching driver other than the drive voltage.

26 Claims, 10 Drawing Sheets

(56) References Cited

U.S. PATENT DOCUMENTS

2025/0317056 A1* 10/2025 King .................. H02M 7/4837
2025/0317141 A1* 10/2025 King ..................... H03F 3/2173

OTHER PUBLICATIONS

Zhang, H., et al., A High-Linearity and Low-EMI Multilevel Class-D Amplifier, IEEE Journal of Solid-State Circuits, vol. 56, No. 4, Apr. 2021, pp. 1176-1185.

Zhang, H., et al., A-107.8 dB THD+N Low-EMI Multi-Level Class-D Audio Amplifier, Downloaded Aug. 6, 2024 from IEEE XPlore.

* cited by examiner

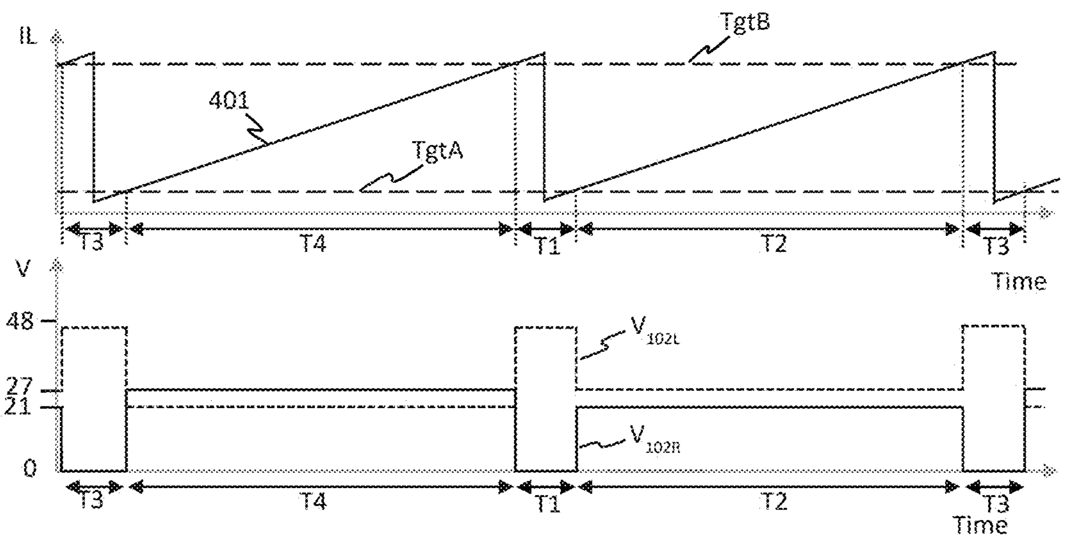
Figure 4
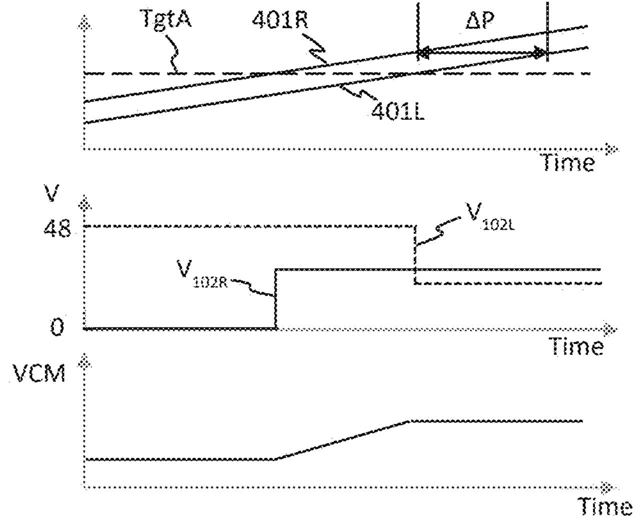
Figure 5a
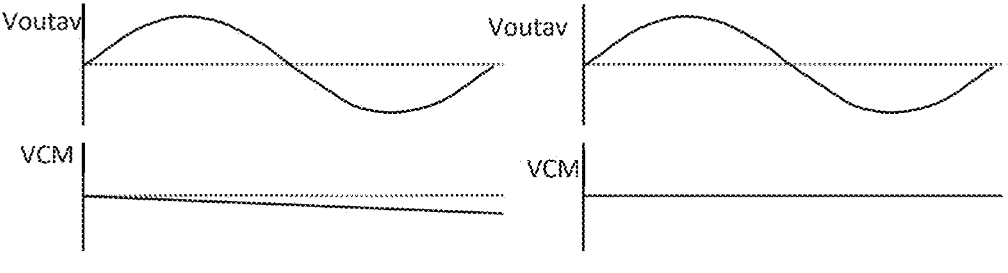
Figure 5b
Figure 5c

SWITCHING DRIVERS

FIELD OF DISCLOSURE

The field of representative embodiments of this disclosure relates to methods, apparatus and/or implementations concerning or relating to switching driver circuits, and in particular to switching driver or amplifier circuits as may be used to drive a transducer, such as an audio transducer.

BACKGROUND

Many electronic devices include transducer driver circuitry for driving a transducer with a drive signal, for instance for driving an audio output transducer of the device or a connected accessory, with an audio drive signal.

In some applications, the transducer driver circuitry may include a switching driver, e.g. a class-D amplifier or the like, for generating the drive signal. Switching drivers, sometimes referred to as switched-mode drivers or switched-mode amplifiers, can be relatively power efficient and thus can be advantageously used in some applications. A switching driver generally operates to switch an output node between different switching voltages, with a duty cycle that provides a desired drive signal voltage, on average over the course of one or more switching cycles.

Multi-level switching drivers, also referred to as multi-level converters, have been proposed which modulate the output node(s) of the switching driver between selected ones of a set of at least three different switching voltages. For instance, rather than just modulate an output node between high and low switching voltages, say VDD and ground, the relevant output node could be modulated with a controlled duty-cycle between an intermediate voltage, such as VDD/2 for example, and a selected one of the high and low switching voltages depending on the desired output voltage. Switching between VDD and VDD/2, or between VDD/2 and ground, reduces the magnitude of the modulation in voltage at the output node, with benefits of reduced ripple current and EMI emissions. In some cases, capacitors may be used as part of the switching driver, e.g. as flying capacitors, to provide at least one of the switching voltages. One example is a multi-level switching driver arrangement based on a known flying capacitor multi-level inverter topology.

Known multi-level flying capacitor switching drivers typically require relatively complex control arrangements for monitoring the voltages of the flying capacitors and adjusting the switching sequence in response to maintain charge balance and hence maintain the correct voltage on the flying capacitors.

It is desirable to provide an amplifier design which provides improved efficiency and regulation of supply voltages.

SUMMARY

According to an aspect of the disclosure there is provided a switching driver control circuit for controlling a switching driver to drive a load with a drive signal based on an input signal. The circuit comprises a controller configured to control modulation of at least a first driver output node of the switching driver between selected switching voltages of a set of at least four different switching voltages according to a switching pattern to generate said drive signal. The controller is configured such that, for a given level of drive signal, the controller can selectively operate with a plurality of different switching patterns. The controller is configured to select a switching pattern from said plurality of different switching patterns for operation to control at least one parameter of the switching driver other than the drive voltage.

In some examples, the set of at least four different switching voltages may comprise at least first and second switching voltages which are provided by a capacitor network and the at least one parameter of the switching driver may comprise the values of said first and second switching voltages.

In some implementations, the switching driver may be configured to drive the load in a bridge-tied-load configuration between the first driver output node and a second driver output node. The controller may be further configured to control modulation of the second driver output node between selected switching voltages of the set of at least four different switching voltages according to the switching pattern to generate the drive signal. The at least one parameter of the switching driver may comprise a voltage differential between the first and second switching voltages and the controller may be configured to control a duty cycle of modulation of each of the first and second driver output nodes to generate said drive signal and to control said voltage differential. The at least one parameter of the switching driver may additionally or alternatively comprise a common mode voltage of the first and second switching voltages and the controller may be configured to control a relative timing of a transition in voltage of the first output node compared to a transition in voltage of the second output node to regulate the common mode voltage. The controller may be configured to control the transition in voltage of the first and second output nodes based on respective first and second carrier signals and the controller may be configured to control the relative phase of the first and second carrier signals to control said relative timing of the transition in voltage connection of the first and second output nodes. Alternatively, the controller may be configured to control the transition in voltage of the first and second output nodes based on comparison of a carrier signal against respective first and second threshold values and the controller may be configured to control any offset between the first and second threshold values to control said relative timing of the transition in voltage connection of the first and second output nodes.

In some examples, the set of at least four different switching voltages may comprise: the first and second supply voltages and first and second switching voltages which are provided by respective first and second nodes of a capacitor network which, in use, is connected between first and second supply voltages and which comprises a driver capacitance coupled between the first and second capacitor nodes. The capacitor network may further comprises a first reference capacitance connected between the first supply voltage and the first capacitor node and a second reference capacitance connected between the second capacitor node and the second supply voltage. The controller may be configured to control the first switching driver to selecting operate in any of: a first state in which the first output node is connected to the first supply voltage and the second output node is connected to the second supply voltage; a second state in which the first output node is connected to the first switching voltage and the second output node is connected to the second switching voltage; a third state in which the first output node is connected to the second switching voltage and the second output node is connected to the first switching voltage; and a fourth state in which the first output node is connected to the second supply voltage and the first output node is connected to the second supply voltage. Operation in said states is controlled in accordance with the selected switching pattern.

In some examples, the controller may configured to be operable in a first mode of operation, in which: for a drive signal of one polarity the switching drive is operated in a switching cycle that includes at least one instance of each of the first, second and third states and for a drive signal of an opposite polarity the switching drive is operated in a switching cycle that includes at least one instance of each of the fourth, second and third states. In the first mode of operation, the controller may be configured to control the relative duration of the instances of the second and third states in the switching cycle to regulate an intermediate voltage of said driver capacitance. The controller may be configured to regulate the intermediate voltage of said driver capacitance so as to dynamically vary a value of the intermediate voltage based on at least one operating parameter of the switching driver. The controller may be further configured to be operable in a second mode of operation, for drive signals with a magnitude less than the intermediate voltage of said driver capacitance, in which: the first switching driver is operated in a switching cycle that includes at least one instance of each of the second and third states and does not include any instances of the first or fourth states. The controller may further be configured to be operable in a third mode of operation, for drive signals with a magnitude less than the intermediate voltage of said driver capacitance, in which: for a drive signal the one polarity the first switching drive is operated in a switching cycle that alternates between operation in the first state and the third state and for a drive signal of the opposite polarity the switching drive is operated in a switching cycle that alternates between the fourth state and the second state. The controller may be configured to intersperse operation in one or more switching cycles in the second mode of operation with operation in a switching cycle in the third mode of operation to maintain the intermediate voltage of said driver capacitance. In some examples, the first switching driver may be configured, in use, to drive the load via a filter arrangement comprising a series inductor in an output path between the first and second output terminals, and operation in the third mode may be configured to transfer energy derived from one of the first and second supply voltages to the driver capacitance via the inductor of the filter arrangement.

In some examples, the first switching driver may be configured, in use, to drive the load via a filter arrangement comprising a series inductor in an output path between the first and second output terminals, and the first switching driver may be operable, in one mode of operation, to select a switching pattern from said plurality of different switching patterns that: transfers energy derived one of the first and second supply voltages to the inductor of the filter arrangement and transfers energy from the inductor of the filter arrangement to the driver capacitance without resulting in any significant load current in a signal band for the drive signal.

In some implementations, the switching driver may be one of a plurality of switching drivers configured to drive respective loads in a bridge-tide load configuration by modulating a pair of output nodes between selected switching voltages of said set of at least four different switching voltages including said first and second switching voltages which are provided by the capacitor network. The controller may be configured to control a respective switching pattern for each of the plurality of switching drivers to generate a respective drive signal and to control the values of said first and second switching voltages. The controller may be configured to control the respective switching pattern for each of the plurality of switching drivers based on an indication of which of the plurality of switching drivers is drawing current from or supplying current to the capacitor network.

In some implementations, the switching driver may be configured to drive the load in a single-manner configuration, with the load coupled between the first driver output terminal and a DC voltage node. A DC voltage at the DC voltage node may be maintained by a common-mode capacitance that forms part of the capacitor network. The switching driver may further comprise at least one additional driver output node configured to drive at least one additional load with a respective drive signal, each additional load being coupled between the relevant additional driver output node and the DC voltage node. The controller may be configured to control modulation of the or each additional output node of the switching driver between selected switching voltages of said set of at least four different switching voltages according to a respective switching pattern to generate the respective drive signal. The controller may be configured to select a respective switching pattern for each of the first driver output node and additional driver output nodes to control the values of said first and second switching voltages.

In some examples, the switching driver control circuit may further comprise at least one current or voltage source configured to transfer charge to or from the capacitor network. The controller may be further configured, in at least one more operation, to control the at least one current or voltage source to control at least one of a common mode voltage of the capacitor network and a voltage differential between the first and second switching voltages.

In some examples, the set of at least four switching voltages may not be evenly spaced from one another.

Aspects also relate to a switching driver comprising the switching driver control circuit of any of the embodiments described herein and a network of switches for selectively connecting the at least one driver output node to any of the set of the four switching voltages.

In another aspect, there is provided a switching driver circuit for driving a load comprising: first and second driver output nodes for outputting a differential drive signal for driving the load and a driver switch network operable in a plurality of different switch states. The switch states comprise: a first switch state wherein the first output node is connected to a first switching voltage and the second output node is connected to a second switching voltage; a second switch state wherein the first output node is connected to the second switching voltage and the second output node is connected to the first switching voltage; a third switch state wherein the first output node is connected to a first terminal of a driver capacitance and the second output node is connected to a second terminal of the driver capacitance, the driver capacitance providing an intermediate voltage across the first and second terminals of the driver capacitance; and a fourth switch state wherein the first output node is connected to the second terminal of the driver capacitance and the second output node is connected to the first terminal of the driver capacitance. A controller is configured to control the driver switch network to operate in a sequence of said switch states to generate said differential drive signal based on an input signal, wherein the controller is configured such that operation of driver switch network in said sequence of switch states to generate said differential drive signal provides voltage regulation of the intermediate voltage provided by said driver capacitance.

In a further aspect, there is provided a switching driver circuit for controlling a switching driver to drive a load with a drive signal based on an input signal comprising: a capacitor network comprising a plurality of capacitors connected between first and second supply voltages to define a different first and second switching voltages at respective first and second capacitor nodes; and a controller configured to control sequencing of connection of each of first and second driver output nodes to any of a set of switching voltages including said first and second different switching voltages to generate the drive signal; wherein the controller is configured to control said sequencing so as to generate the desired signal and also provide voltage regulation of the first and second switching voltages at the respective first and second capacitor nodes.

It should be noted that, unless expressly indicated to the contrary herein or otherwise clearly incompatible, then any feature described herein may be implemented in combination with any one or more other described features.

BRIEF DESCRIPTION OF THE DRAWINGS

For a better understanding of examples of the present disclosure, and to show more clearly how the examples may be carried into effect, reference will now be made, by way of example only, to the following drawings in which:

FIG. 4 illustrates one example of switching control of the switching driver of FIG. 1;

FIG. 5*a* illustrates an example of carrier phase control for common mode regulation, and FIGS. 5*b* and 5*c* illustrate examples of switching control without and with common mode regulation;

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Figure 1:
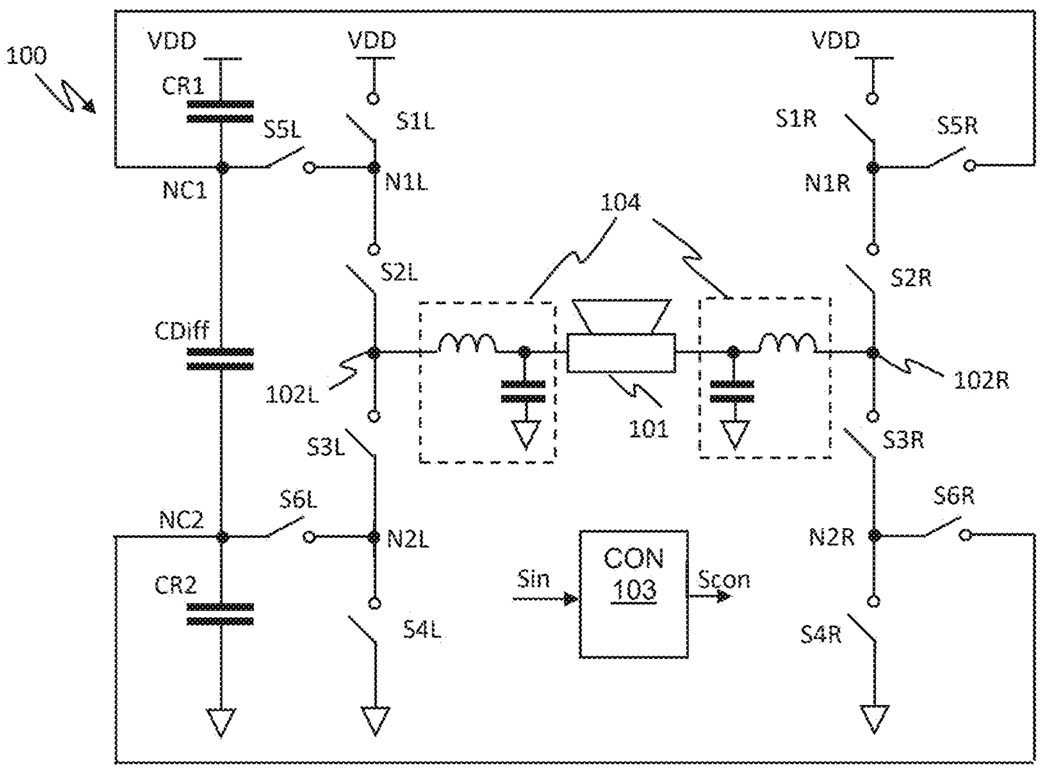
FIG. 1 illustrates one example of switching driver according to an embodiment for driving a load in a BTL configuration.

FIG. 1 illustrates one example of a switching driver 100 according to an embodiment of this disclosure for driving a load 101.

The switching driver 100 comprises a first output node 102L and a second output node 102R and a network of switches for selectively connecting each of the first and second output nodes to different voltages.

In the example of FIG. 1, the first and second output nodes 102L and 102R are connected on opposite sides of an output path comprising the load 101, which may be a transducer load such as an audio output transducer or similar, and thus are arranged to drive the load 101 in a bridge-tied-load (BTL) configuration. However, as will be described in more detail below, in some implementations the first and second output nodes could be arranged to drive different loads from one another.

In the example of FIG. 1, switches S1L and S2L are connected in series between a first supply voltage, in this example VDD, and the first output node 102L, with a midpoint node N1L between these switches, and likewise switches S1R and S2R are connected in series between the first supply voltage and the second output node 102R with a midpoint node N1R. Further switches S3L and S4L are connected in series between the first output node 102L, and a second supply voltage, in this example ground, with a midpoint node N2L between these switches, and likewise switches S3R and S4R are connected in series between the second output node 102R and the second supply voltage and with a midpoint node N2R.

In addition, a capacitor network or capacitor string is arranged in series between the first supply voltage (VDD) and the second supply voltage (ground). The capacitor string comprises a first capacitor CR1, which will be referred to a first reference capacitor, connected between the first supply voltage and a first capacitor string node NC1, a second capacitor CDiff, which will be referred to as a driver capacitor, connected between the first capacitor string node NC1 and a second capacitor string node NC2, and a third capacitor CR2, which will be referred to as second reference capacitor connected between the second capacitor string node NC2 and the second supply voltage.

The first capacitor string node NC1 is coupled with the midpoint node N1L via switch S5L, and is further coupled with the midpoint node N1R via switch S5R. The second capacitor string node NC2 is coupled with the midpoint node N2L via switch S6L, and is further coupled with the midpoint node N2R via switch S6R.

In use, the driver capacitor CDiff defines an intermediate voltage that is isolated from the supply voltages. The intermediate voltage across the driver capacitor defines the voltage difference between the first and second nodes NC1 and NC2 of the capacitor string, and, together with the reference capacitors CR1 and CR2, defines the voltages at these nodes, which, in use, can be used as first and second defined switching voltages for modulation of the first and second output nodes 102L and 102R. In use, the average differential output voltage of the switching driver, i.e. the average differential voltage between the first and second output nodes 102L and 102R, can be generated through controlled switching of the switches of the circuit, and based on the first and second supply voltages and the first and second defined switching voltages provided by the intermediate voltage. Furthermore, the switching action of the circuit can provide for regulation of the intermediate voltage on the driver capacitor CDiff and the first and second defined switching voltages. Whilst, in some implementations, the switching driver circuit may be operable to maintain the intermediate voltage of the driver capacitor CDiff at a nominally constant voltage level, to maintain nominally constant first and second defined switching voltages, in some implementations the voltage level of the intermediate voltage may be dynamically adjusted through control of the switching action, in that charge can be added to or taken away from the capacitors of the string through appropriate connection of the supply voltages to the different nodes of the string. Dynamic adjustment of the level of the intermediate voltage can provide for more efficient operation of the switching driver, as the intermediate voltage level can determine the magnitude of the switching steps involved.

The switching of the driver circuit may be controlled by a controller 103 which adjusts the switching cycle of the circuit based on an input signal Sin (e.g. an audio input signal) as well as a voltage regulation control algorithm. The controller 103 may thus receive the input signal Sin and determine appropriate switch control signals Scon for controlling the switches of the switching driver, with the switches being controlled to implement a desired sequence of switch states, where the selection and relative timing of the different switch states in the sequence leads to the desired average output voltage over the course of the switching sequence, i.e. a desired drive voltage, and which provides regulation of the intermediate voltage (and the first and second defined switching voltages) to a desired level.

In at least some implementations, there may be an output filter arrangement 104 for applying filtering in the output path. As will be understood by one skilled in the art, in some applications some filtering in the output path may be important, for instance for relatively high-power applications, e.g. for applications for driving an output power of 10 mW or greater, and/or where the output path between the output nodes of the switching driver and the load 101 may be relatively long, e.g. of the order of tens of centimetres or greater. For example, audio systems in automotive applications and home theatre and the like may typically be required to output relatively high output powers and may have output paths of the order of tens of centimetres to meters between the switching driver and the loudspeaker being driven and, in such applications, EMI may be a particular concern. Filtering of the output path may thus be important. Typically, the output filter may comprise an LC (inductance-capacitance) filter arrangement which is separate to the load 101. FIG. 1 illustrates one example of a basic filter arrangement with a series inductance in the output path and capacitance between the output path and a defined reference voltage, such as Ground, on each side of the load. Other LC filter arrangements may be implemented, however, as would be understood by one skilled in the art, but in general there may be some significant inductance in the output path. Additionally, there may be some capacitance across the load 101. The filter arrangement 104 will generally be configured to provide desired filter characteristics for the relevant application, e.g. for audio applications the filter arrangement 104 may be implemented to provide a cut-off frequency above about 20 kHz. Embodiments of the present disclosure may thus be configured to be able to drive the load via an LC filter arrangement with at least one inductor in the output path. In the full bridge (BTL) case, the filter will generally be symmetric.

As noted, above, the switching driver 100 may be controlled to operate in a sequence of switch states to generate a desired output voltage and provide regulation of the voltages of the capacitor string.

Figure 2A:
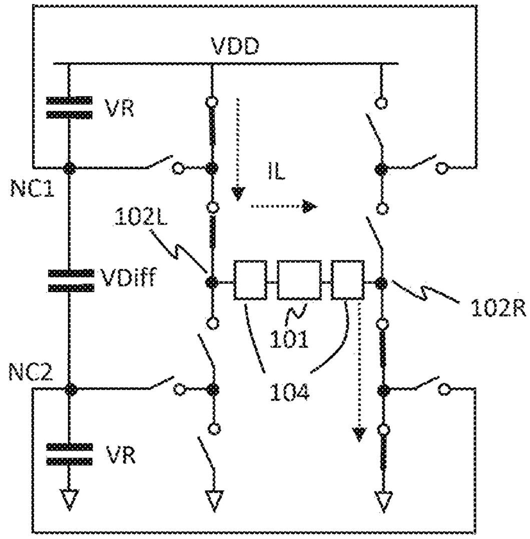
FIGS. 2*a*, 2*b*, and 2*c* illustrate states of operation of the switching driver of FIG. 1.
Figures 2B, 2C, 3:
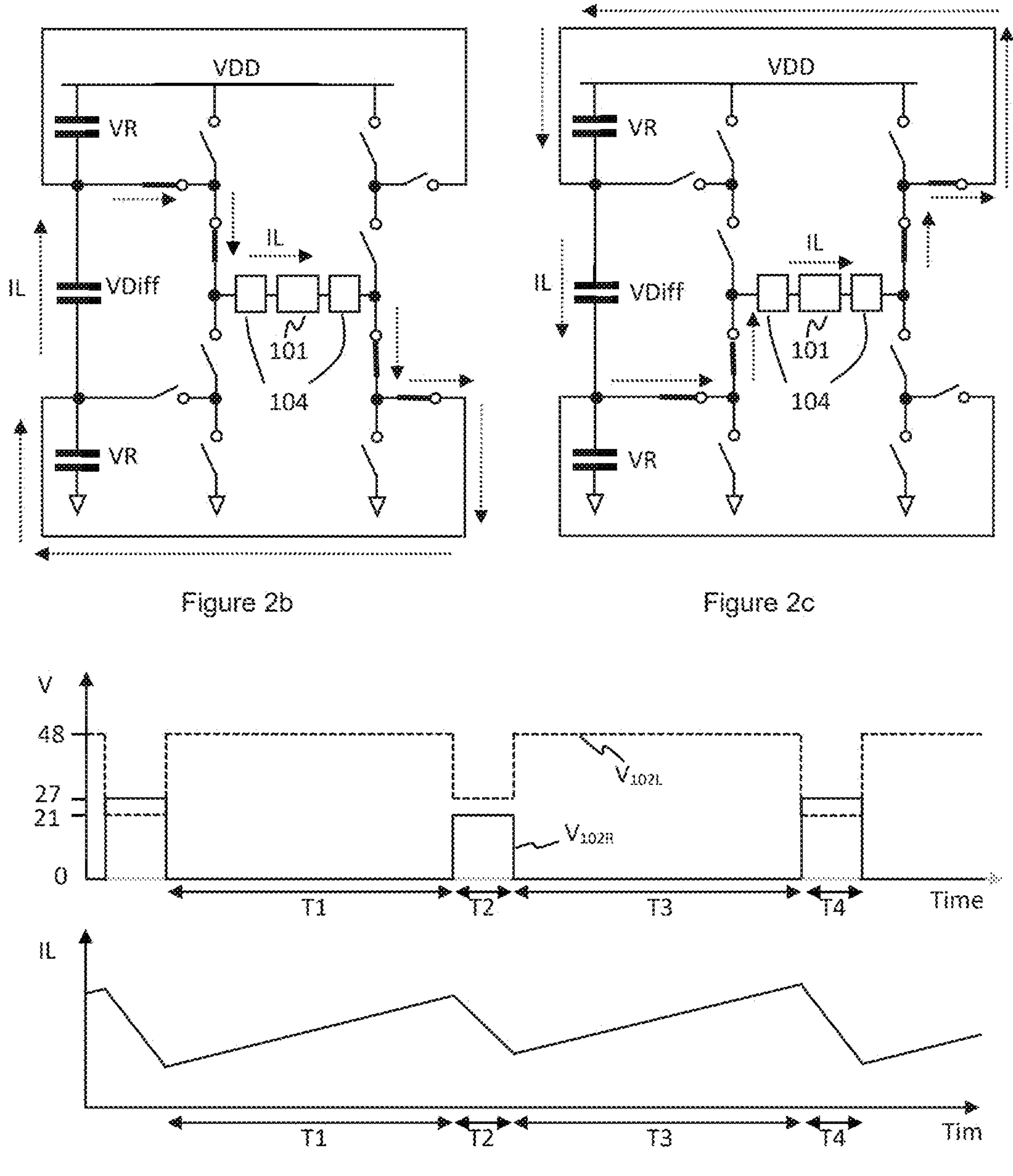
FIG. 3 illustrates example switching waveforms for the switching driver of FIG. 1.

FIGS. 2*a*, 2*b*, and 2*c* illustrate examples of three example switch states that may be used as part of a sequence of switch states to deliver an output current to the load that flows from the first output node 102L to the second output node 102R. For the purposes of discussion herein, such a direction of current flow will be taken to be a positive output current, and a positive output voltage will be taken to mean that the voltage at the first output node 102L is more positive than the voltage at the first output node 102R, with a negative output current and a negative output voltage being the opposite.

FIGS. 2*a*, 2*b*, and 2*c* illustrate a switching driver 100 with the same structure as that discussed with reference to FIG. 1, but which omits the controller 103 and some of the switch labels for clarity. These figures illustrate that each of the reference capacitors CR1 and CR2 may be charged to the same nominal reference voltage VR and the driver capacitor CDiff is charged to a voltage referred to as VDiff. The first supply voltage will be taken to be a positive supply voltage VDD and the second supply voltage will be taken to be ground.

Purely by way of example, the first supply voltage VDD may be assumed to be +48V, the nominal voltage VR on each of the reference capacitors CR1 and CR2 may be assumed to be 21V and the voltage VDiff of the driver capacitor CDiff may be assumed to have a nominal voltage of 6V. The nominal voltage at node NC1 of the capacitor string, which can be seen as the first defined switching voltage, will thus be 27V and the nominal voltage at node NC1 of the capacitor string, which can be seen as the second defined switching voltage, will thus be 21V.

FIG. 2*a* illustrates a first switch state which leads to a positive output voltage equal to +VDD between the output nodes 102L and 102R, i.e. a +48V differential voltage in this example. In this first switch state, switches S1L and S2L are closed to connect the first output node 102L to VDD, e.g. 48V, and switches S3R and S4R are closed to connect the second output node 102R to the ground. The output current IL to the load (and through the output inductance) thus flows from VDD to the load and then to Ground. This state involves no charging or discharging of driver capacitor CDiff (or the reference capacitors CR1 and CR2 of the capacitor string).

FIG. 2*b* illustrates a second switch state which leads to a positive voltage of +VDiff between the output nodes 102L and 102R, i.e. a +6V differential voltage in this example. In this second switch state, switches S2L and S5L are closed to connect the first output node 102L to the first defined switching voltage at node NC1 of the capacitor string, which as noted has a nominal value of 27V. Switches S3R and S6R are closed to connect the second output node 102R to the second defined switching voltage at node NC2 of the capacitor string, which as noted has a nominal value of 21V. This thus generates a differential voltage with a nominal value of +6V between the output nodes. The load current IL is drawn from the capacitor CDiff and flows to the load via switches S5L and S2L. This state thus results in the capacitor CDiff being discharged.

FIG. 2*c* illustrates a third switch state which leads to a voltage of −VDiff between the output nodes 102L and 102R, i.e. a −6V differential voltage in this example. In this second switch state, switches S3L and S6L are closed to connect the first output node 102L to the second defined switching voltage at node NC2 of the capacitor string, which as noted has a nominal value of 21V. Switches S2R and S5R are closed to connect the second output node 102R to the first switching voltage at node NC1 of the capacitor string, which as noted has a nominal value of 27V. This, thus, generates a differential voltage with a nominal value of −6V between the output nodes. Because of the inductance of the output path, in this state a positive output current IL may continue to flow and thus current will flow, from node NC2 to the output node 102L and then from output node 102R to node NC1 to charge the capacitor CDiff. This state thus results in the capacitor CDiff being charged for a positive output current.

A sequence of these three states can be used to generate a desired positive drive voltage, i.e. a positive average output voltage over the course of the sequence. During a switching cycle, the switching driver 100 can be switched to the first state, with a differential output voltage of +VDD, for a certain proportion of the switching cycle period. The remainder of the switching cycle will then comprise at least one instance of operation in the second state, with a differential output voltage of +VDiff, and at least one instance of operation in the third state that provides a differential output voltage of −VDiff. Since the switching driver must maintain not only the desired average differential output voltage for driving the load, i.e. maintain a desired volt second balance on the output inductor, but also provide charge balancing of the CDiff capacitor (which maintains the intermediate voltage and the defined switching voltages), the switching of the switching driver alternates between the +VDiff and −VDiff configurations, i.e. between the second and third switch states. If the switching driver returns to the +VDD configuration between instances of the +VDiff and −VDiff configurations, i.e. returns to the first switch state after each instance of the second switch state or third switch state, this can result in a 4-event cycle to maintain both V*s balance and charge balance. However, it will be understood that the switching driver may be operable in a 3-event cycle mode.

For example, a switching sequence of +VDD, +VDiff, +VDD, −VDiff can maintain the charge balance on the CDfiff capacitor if the time spent in +VDiff second switch state is approximately equal to time spend in −VDiff third switch state. For definition purposes, the switching sequence may therefore be defined to be 4 events, e.g. VDD for a period T1, +VDiff for a period T2, VDD for a period T3 and −VDiff for a period T4, where TT is the period of the 4 events, i.e. TT=T1+T2+T3+T4. In a balanced steady state scenario with a DC output voltage, T1 is approximately equal to T3 and T2 is approximately equal to T4.

FIG. 3 illustrates waveforms of output current IL and switching voltages in steady state operation, i.e. where the switching driver is operated to maintain a desired average output voltage, for an example of a positive output current and an average differential output voltage which is greater than VDiff.

The top plot illustrates the voltage $V_{102L}$ (dotted line) at the first output node 102L over the course of the switching sequence and also the voltage $V_{102R}$ (solid line) at second output node 102R.

The lower plot illustrates the output current IL, which thus represents the current through the inductor(s) of the output path.

During the period T1, the switching driver is switched to the first state illustrated in FIG. 2*a*, and thus the voltage $V_{102L}$ at the first output node 102L is driven to VDD, i.e. 48V in this example, and the voltage $V_{102R}$ at the second output node 102R is driven to ground. This results in a positive voltage across the inductor(s) in the output path, with the result that the output current IL ramp ups, i.e. to become more positive. As noted above, in this state the load current IL is drawn from the VDD supply and there is no charging or discharging of CDiff.

During the period T2, the switching driver is switched to the second state illustrated in FIG. 2*b*, and thus the voltage $V_{102L}$ at the first output node 102L is driven to the voltage at node NC1, i.e. the first defined switching voltage which is nominally 27V in this example, and the voltage $V_{102R}$ at the second output node 102R is driven to the voltage at node NC2, i.e. to the second defined switching voltage which is nominally 21V in this example. In this case, the voltage across each inductor of the output path will be negative (due to the voltage maintained by the inductor itself) and the inductor current, and hence load current IL, will ramp downwards, i.e. become less positive. In this state, this load current IL will be drawn from the driver capacitor CDiff and thus there will be discharging of the driver capacitor CDiff. This will result in a slight droop of the voltage VDiff over the period T2.

During period T3, the switching driver is switched back to the first state which results in the load current IL ramping up again.

In period T4, the switching driver is switched to the third state illustrated in FIG. 2*c*, and thus the voltage $V_{102L}$ at the first output node 102L is driven to the second defined switching voltage at node NC2, i.e. nominally 21V in this example, and the voltage $V_{102R}$ at the second output node 102R is driven to the first defined switching voltage at node NC1, nominally 27V in this example. In this case, the voltage across each inductor of the output path will again be negative (due to the voltage maintained by the inductor itself) and the inductor current, and hence load current IL, will ramp downwards, i.e. become less positive. In this state, this load current IL will be supplied to the driver capacitor CDiff and thus there will be charging of the driver capacitor CDiff. This will result in a slight increase of the voltage VDiff over the period T4.

For ideal steady state operation, assuming that the durations of periods T1 and T3 are equal to one another and the durations of periods T2 and T4 are also equal to one another, the total amount of charge drawn from the driver capacitor CDiff during period T2 will be equal to the total amount of charge supplied to the driver capacitor CDiff during period T4. It will be understood that the rate of change of current in period T2 will be lower than the rate of current in period T4 (due to the different effective voltage differences across the inductors in the different states), but the average current across the period will be the same due to different starting currents. Thus, over the course of a whole switching cycle, i.e. one cycle of T1, T2, T3, T4, charge on the driver capacitor CDiff will be balanced.

The discussion above has focused on switching to generate a positive average voltage across the load and with a positive load current flowing. To generate a negative average differential voltage across the load, the first state illustrated in FIG. 2*a* may be omitted from the sequence and instead the switching driver may be switched into a fourth switch state which drives the second output node 102R to VDD, by closing switches S1R and S2R and which drives the first output node 102L to ground, by closing switches S3L and S4L. This state results in a differential voltage between the first and second output nodes 102L and 102R of −VDD, i.e. −48V in this example.

By alternating in a sequence using this −VDD state instead of the +VDD state, e.g. a 4-event sequence −VDD, +VDiff, −VDD, −VDifff, a desired negative average output voltage, i.e. a negative drive voltage, can be driven across the load and a negative load current may flow in a similar manner as discussed above. It will be understood that if a negative load current IL is flowing, the direction of current flow illustrated in FIGS. 2*b* and 2*c* will be reversed and the +VDiff state illustrated in FIG. 2*b* will result in charging of the driver capacitor CDiff and the −VDiff state illustrated in FIG. 2*c* will result in discharging of the driver capacitor CDiff.

For operation to generate a negative drive voltage, the switching driver may thus likewise be switched in a sequence of four periods, T1, T2, T3 and T4, but in this case the periods T1 and T3 will involve operation in the −VDD state (but periods T2 and T4 may involve operation in the +VDiff and −VDiff states as previously discussed). Again, the duration of periods T1 and T3 may be substantially equal to one another and the periods T2 and T4 may be substantially equal to one another.

Using the knowledge that, for both positive and negative output signals, T2 is approximately equal in duration to T4 and T1 is approximately equal in duration to T3, the average differential voltage that is applied during the T2 and T4 periods is approximately zero. Put another way, the output node 102L is modulated between the first defined switching voltage at node NC1, e.g. a nominal voltage of 27V, and the second defined switching voltage at node NC2, e.g. a nominal voltage of 21V, for equal durations in the T2 and T4 periods, leading to an average voltage of 24V at the first output node 102L due to operation in these states. The output node is modulated between the second defined switching voltage at node NC2, e.g. the nominal voltage of 21V, and the first defined switching voltage at node NC1, e.g. the nominal voltage of 27V, for equal durations in the T2 and T4 periods, leading to an average voltage of 24V at the second output node 102R due to operation in these states, and thus the average differential voltage in operation in these states is approximately zero.

As such, the modulation can be simplified into a single carrier waveform with a toggle in the polarity of the application of the +VDD or −VDD states and with the appropriate one of the +VDD or −VDD states being used in periods T1 and T3 based on the required polarity of the average output signal over the whole switching sequence. The period of the carrier is then equal to one-half the period of the 4-cycle event, e.g. equal to the period T1+T2 (or equivalent T3+T4).

FIG. 4 illustrates one example of a suitable carrier signal 401 and the resulting modulation of the voltages $V_{102L}$ and $V_{102R}$ at the first and second output nodes respectively. As illustrated in FIG. 4, the modulation may compare the carrier signal, which in this example has a triangle waveform, against two target thresholds, TgtA and Tgtb, which are determined based on the desired average output voltage, i.e. from the desired drive voltage, based on the input voltage. If the carrier waveform ramps from a normalised range of −1 to +1 (or vice versa) and the desired drive voltage is normalised in the range of −1 to +1, the target thresholds can be calculated as:

TgtA=abs(desired drive voltage)−1

TgtB=1−abs(desired drive voltage)

When the carrier 401 is less than TgtA or greater than TgtB, the controller 103 is configured to control the switches of the switching driver are configured to connect one of the first and second output nodes to the first supply voltage VDD and the other of the first and second output nodes to ground, depending on whether the desired drive signal is positive or negative. When the carrier 401 is between TgtA and TgtB, the controller 103 controls the switching driver so that one of the first and second output nodes is connected to the first defined switching voltage at node NC1 and the other of first and second output nodes is connected to the second defined switching voltage at node NC2, with the relevant connection of the nodes being alternated in successive carrier cycle, e.g. the relevant connection may be controlled based on whether the carrier is on an odd or an even cycle. By using the switching sequence and modulation described above, the common mode of the switching sequence is DC and, as such, is similar to AD modulation that is well known in the prior art with respect to common mode.

It will be understood, however, that this is just one example of a possible modulation scheme and other modulation schemes could be implemented.

As noted above, in ideal operation, ensuring that the periods of operation in the +VDiff state of FIG. 2*b* and in the −VDiff state of FIG. 2*c* should result in correct charge balance of the driver capacitor CDiff over the course of a switching sequence, which thus maintain the voltage VDiff of the driver capacitor CDiff at the desired nominal value, and consequently the first and second defined switching voltages at the nodes NC1 and NC2 of the capacitor string.

However, in practice, factors such as losses in the switching driver and/or inaccuracies in the durations of the periods T2 and T4 may result in an imbalance in charge over the course of the switching sequence. Such a charge imbalance may result, over the course of several cycles, in an unwanted variation from the desired nominal voltage for the driver capacitor CDiff, i.e. the intermediate voltage VDiff may not simply exhibit a small ripple around the desired nominal voltage due to operation in the charging and discharging states, but may drift over time away from the desired nominal voltage.

Thus, in at least some implementations, the intermediate voltage VDiff on the driver capacitor may be actively regulated. The voltage VDiff may be regulated by controlling the relative durations of operation in the +VDiff and −VDiff states.

As noted above, for positive output currents, operation in the +VDiff state illustrated in FIG. 2*b* results in discharging of the driver capacitor CDiff and operation in the −VDiff state results in charging of the driver capacitor, with the opposite occurring for negative output currents. Thus, to increase the charge on the driver capacitor CDiff, the switching driver could be operated in the relevant state that charges it for a greater proportion of the switching cycle and/or the proportion of the switching cycle in which the states which discharges the driver capacitor CDiff could be reduced.

Varying the relative proportion of time that the switching driver spends in the +VDiff state compared to the −VDiff state will result in the average voltage from these two states no longer being zero, however the durations T2 and T4 can also be adjusted relative to the durations T1 and T3 to maintain as desired average output voltage for the whole switching cycle.

It will thus be understood that a deliberate difference between the nominal durations of periods T2 and T4 may be introduced, so that the period of the state where the driver capacitor CDiff is charged may have a nominal duration which is longer or shorter than the period of the state in the which the driver capacitor CDiff is discharged.

In some instances, such a difference in the nominal durations may be introduced to compensate for losses in the converter and/or inaccuracies in the timings of the actual durations, to improve the charge balancing of the driver capacitor CDiff over each switching cycle.

In some implementations the durations of the periods of +VDiff and −VDiff states may be controlled so as to provide a net gain or loss in charge from the driver capacitor CDiff over the course of the switching cycle. As noted above, this could be implemented to provide longer term voltage regulation of the driver capacitor voltage VDiff to a desired voltage, e.g. if several cycles of operation result in the driver capacitor voltage VDiff drooping below the desired nominal value, the switching driver could be operated to provide a net charge gain over one or more switching cycles to restore the voltage VDiff to the desired nominal value.

It will be noted, however, that the charging and discharging of the driver capacitor CDiff may be controlled so as to provide a net gain or loss in charge from the driver capacitor CDiff over the course of the switching cycle so as to dynamically vary the nominal value of the driver capacitor voltage in use.

It should be understood from the foregoing that the value of the intermediate voltage VDiff could be set to any value between the first and second supply voltages, e.g. between VDD and ground. It will be clear that for the case when T2=T4, the average output voltage is essentially independent of the intermediate voltage VDiff. When the duration of the period T2 does not equal the duration of the period T4, then the average output voltage does have a dependence on the intermediate voltage VDiff, but the relevant durations of the different switch states, i.e. the periods T1, T2, T3 and T4 can be collectively controlled to provide any desired average output voltage in the range of +VDD to −VDD, i.e. the duty-cycle of the various states in the switching sequence can be controlled to effectively compensate for the contribution due to operation in the +VDiff and −VDiff states. This means that the nominal value for VDiff can be set to any desired value.

In some use cases, it may be beneficial to regulate the intermediate voltage VDiff of the driver capacitor CDiff to a constant nominal value, and by extension regulate the first and second defined switching voltages at nodes NC1 and NC2 to constant nominal values. For the example described above, with supply voltages of 48V and ground, the intermediate voltage VDiff could be regulated to a constant nominal value such as 6V, with the first and second switching voltages being regulated to nominally constant values of 27V and 21V respectively. It will be understood that these are just examples however and any desired value of intermediate voltage may be selected depending on the use case and supply voltages.

In some use cases, however, it may be advantageous to dynamically vary the nominal value of the intermediate voltage VDiff of the driver capacitor CDiff in use. For instance, power efficiency and/or other aspects of performance may, in some cases, be improved by dynamically varying the value of the intermediate voltage, for instance based on some parameter of operation. For instance, there can, in some cases, be benefits in varying the value of the intermediate voltage VDiff based on the level of the input/output signal, e.g. based on signal amplitude in a manner somewhat analogous to envelope tracking in other amplifier topologies. Thus, for example, in some use cases the intermediate voltage VDiff may be set to 6V, with the first and second defined switching voltages being 27V and 21V respectively but in other uses cases the intermediate voltage VDiff may be set to a different value, say reduced to 2V, with the first and second defined switching voltages being 25V and 23V respectively, or increased to 10V with the first and second defined switching voltages being 29V and 19V respectively. The value of the intermediate voltage VDiff may, in some implementations, be dynamically controlled based on at least one of: a received input signal; a generated output voltage; a load current provided at the output node or an output power level. The intermediate voltage VDiff may additionally or alternatively be controlled based on an efficiency measure of the switching driver and/or a switching frequency of the switch states of the switch network. In some cases, the intermediate voltage VDiff may depend on a system configuration, for example the switching driver may be configured to operate in a relatively low-power, low-performance mode, or in a relatively high-power high-performance mode.

The intermediate voltage VDiff of the driver capacitor CDiff may be chosen to be any fraction of the input voltage defined by the first and second supply voltages. It should be noted that voltage steps across the different capacitors of the capacitor string, which effectively define the steps between the various switching voltages that can be used for modulation of the output nodes, do not have to be equal to one another. In the example described above, the difference between the supply voltage VDD at 48V and the first defined switching voltage at 27V is a 21V difference, whereas the voltage difference between the first and second defined switching voltages at 27V and 21V respectively, is a difference of 6V. The set of switching voltages defined by the first and second supply voltages and the first and second defined switching voltages are not evenly spaced from one another. The difference between the second switching voltage and the second supply voltage should, however, be the same as the voltage difference between the first supply voltage and the first switching voltage, if it is desired that the common mode voltage for the differential output signal be halfway between the first and second supply voltages.

In general, therefore, the intermediate voltage VDiff can be regulated to any desired voltage level (in the range between the first and second supply voltages) and can be regulated at that level by controlling the relative duration of the states that charge and discharge the driver capacitor CDiff.

In general, embodiments of the disclosure make use of the fact that, given a selection of possible switching voltages, in this case the first and second supply voltages, and the first and second defined switching voltages provided by the capacitor string, there is a choice in the pattern of modulation between these voltages that can be used at each output nodes 102L and 102R to provide a desired average output voltage at that node or a desired average differential voltage. Where at least some of these voltages are defined by a capacitance, the relevant pattern can be selected to not only provide the desired average output voltage, but also to provide some control of the defined voltages, e.g. to provide charge balancing or to deliberately provide some net or net loss of charge.

In other words, it will be appreciated that a desired average output voltage may be synthesised by modulation between at least one switching voltage which is higher than the desired average output voltage and at least one switching voltage which is lower than the desired average output voltage, with appropriate relative timings of the modulation, e.g. by using pulse-width modulation. With three or more switching voltages to select from, there are multiple choices as to how to synthesize the desired average output voltage and the different choices can produce the same average output voltage but will vary with respect to the current drawn from or provided to the different voltage sources. By appropriate choice of switching voltages and timing, i.e. of the modulation pattern, the average current drawn or provided to a specific voltage source over the course of the switching cycle can be controlled, which allows for controlled regulation of voltages sources which are stabilized by capacitances.

In the ideal case, regulating the voltage of the driver capacitor CDiff in this way does not result in any variation of the common mode voltage of the capacitor string, provided that, on a change of state, the switch transitions for the first and second output nodes 102L and 102R occur at the same time. For instance, for switching from the +VDD state illustrated in FIG. 2*a* to the +VDiff state illustrated in the FIG. 2*b*, switches S1L and S4R are opened and switches S5L and S6R are closed and the switching transition on one side of the load can be controlled to happen at the same time as the switching transition on the other side of load (with any necessary dead time between opening one switch and closing another to prevent a shoot-through condition). In operation in the +VDiff state of FIG. 2*b*, the first output node 102L is connected to the first capacitor node NC1 of the capacitor string, which is coupled to the positive plate of the driver capacitor CDiff, and the second output node 102R is connected to the second capacitor node NC2, which is coupled to the negative plate of the driver capacitor CDiff. Any load current between the first and second output nodes 102L and 102R is thus 100% differential with respect to the driver capacitor CDiff and this load current does not vary the common mode voltage of the capacitor string. Likewise, in the −VDiff state illustrated in FIG. 2*c* the first output node 102L is coupled to the second capacitor node NC2 and the second output node 102R is coupled to the first capacitor node NC2, so again the current through the output nodes will be 100% differential for the driver capacitor CDiff. Thus, any change in the voltage VDiff, e.g. resulting from a controlled difference in duration of the states that charge and discharge the driver capacitor CDiff, will result in corresponding changes in voltage across the reference capacitors CR1 and CR2 and thus the first and second defined switching voltages at the first and second capacitor nodes NC1 and NC2.

However, one possible source of non-ideal behaviour that can affect the DC voltages of the capacitor string is leakage. If one or more of the capacitors of the string, i.e. the first and second reference capacitors CR1 and CR2 and the driver capacitor CDiff, has a leakage path (parasitic resistance) from either the capacitor or, for example, from the switches that it is connected to, leakage can occur in use and the DC voltage of the capacitor will not remain constant.

Some implementations may therefore be configured to also provide regulation of the common mode voltage of the capacitors of the capacitor string, e.g. the common-mode voltages at the first and second capacitor string nodes NC1 and NC2. In at least some implementations, such common mode regulation may be implemented by applying a controlled difference in timing to the switching transitions at the first and second output nodes 102L and 102R, i.e. on either side of the load.

For instance, consider the transition from the +VDD state illustrated in the FIG. 2*a* to the +VDiff state illustrated in FIG. 2*b*. The transition from the +VDD state to the +VDiff state would be used as part of a sequence for generating a positive average output voltage and thus, at the time of the transition from the +VDD state to the +VDiff state, there would, in normal operation, be a positive load current. If the switch connections for the first output node 102L are changed before the switch connections for the second output node 102R, i.e. switch S1L is opened and switch S5L is closed before switch S4R is opened and switch S6R is closed, there will be a period of time where the first output node 102L is connected to the first capacitor node NC1 whilst the second output node 102R is connected to ground. Given the positive load current IL, any current drawn from the first capacitor node NC1 will be delivered to ground and this will reduce the common-mode voltage of the capacitor string. Conversely, if the switch connections for the first output node 102L are changed after the switch connections for the second output node 102R, i.e. switch S1L is opened and switch S5L is closed after switch S4R is opened and switch S6R is closed, there will be a period of time where the first output node 102L is connected to the first supply voltage VDD whilst the second output node 102R is connected to the second capacitor node NC2. The load current will thus be delivered to the second capacitor node and will increase the common-mode voltage of the capacitor string. Note a similar result will occur for a transition from −VDD.

Similarly, varying the relative timings of the switch transitions on each side of load in transitions between other states can also increase or decrease the common mode voltage of the capacitor string. In general, if one side of the load is connected to one of the supply voltages, VDD or ground, whilst the other the other side of the load is connected to one of the first or second capacitor nodes NC1 or NC2, the common mode voltage of the capacitor string will move in the direction of the relevant supply voltage (assuming that the direction of current flow is generally from VDD and to ground). Thus, by controlling whether the connection to VDD on one side of the load is made before, or persists for longer, than the connection to ground on the other side of the load, or vice versa, the common mode voltage of the capacitor string can be moved in a desired way.

A difference in the timing of the switch transitions for the first and second output nodes 102L and 102R could be provided by using different carriers for control of the switching of the first output node 102L and the second output node 102R and controlling a desired phase shift between the carriers for at least part of the excursion of the carriers.

FIG. 5*a* illustrates an example of such carrier phase control. FIG. 5*a* illustrates an example with a first carrier 401L for controlling switching of the first output node 102L and a second carrier 401R for controlling switching of the second output node 102R. FIG. 5*a* illustrates just part of the excursion of the carriers and illustrates that within this range of excursion there is a phase difference ΔP between the two carriers, in this case the first carrier 401L is delayed with respect to the second carrier 401R. This means that the second carrier 401R, whilst ramping, reaches the relevant target threshold, before the first carrier 401L and thus the switching of the second output node 102R occurs before the switching of the first output node 102L. For the example of FIG. 5*a*, the phase shift is applied to the negative part of the excursion of the carrier, i.e. whilst the carrier is less than zero, and thus the relevant target threshold is threshold in this example is TgtA as discussed with reference to FIG. 4. It will be understood from the discussion of FIG. 4 that, in this example, the carrier crossing the threshold TgtA triggers (for a positive average output voltage) the transition from the +VVD state to one of the +VDiff or −VDiff states. FIG. 5*a* illustrates the transition to the −VDiff state and thus illustrates that the voltage at the second output node 102R transitions from ground to the first defined switching voltage, i.e. 27V in the example above, when the second carrier reaches TgtA, but the voltage at the second output node 102L remains at VDD, i.e. 48V, until the first carrier 401L later reaches TgtA and the voltage at the first output node 102L then transitions from VDD to the second defined switching voltage of 21V. During the delay between the switching transition of the second output node and the first output node, the load current flowing to the first capacitor node NC1 increases the common mode voltage VCM of the capacitor string.

If this same phase difference were maintained between the two carriers for the whole excursion of the carrier, the transition from the −VDiff state back to the +VDD state would also have a similarly staggered transition for switching of the output nodes, but this would lead to a decrease in the common mode voltage VCM of the capacitor string. To avoid this, the phase difference may be reduced to zero for the positive excursion of the carriers so that the switching of the first and second output nodes 102L and 102R occurs at the same time as one another. The phase difference could be reintroduced when the carriers go negative in the next carrier cycle, and the staggered switching caused by the phase difference would again cause non-differential charging of the capacitor string to increase the common mode voltage.

In this way, by control of the relative phasing of carrier signals for the switching of the first and second output nodes 102L and 102R, the DC voltages, and the common mode voltage, of the capacitor string can be regulated.

FIGS. 5*b* and 5*c* illustrate the impact of such regulation. A switching driver such as described with reference to FIG. 1 was simulated with a sinusoidal input signal. An imbalance was added to the simulation to model a resistive path from the switching nodes to ground on both sides of the load. FIG. 5*b* illustrates the output current IL and the common mode voltage VCM of the capacitor string without any regulation. It can be seen that the common mode voltage steadily falls over time due to the simulated leakage. FIG. 5*c* illustrates the output current IL and the common mode voltage VCM of the capacitor string applying the regulation scheme described above. It can be seen that the desired output current can be delivered whilst maintaining a substantially constant common mode voltage for the capacitor string.

Modulation of the carrier phases could also be used to control any desired difference in duration of the +VDiff and −VDiff states to provide regulation of the VDiff voltage as discussed above. For instance, a common phase modulation applied to both carriers 401L and 402L may be varied in alternate carrier cycles so as to controllably vary the duration of the +VDiff state with respect to the −VDiff state. Alternatively different gains could be applied to the different carriers.

In some implementations, different target thresholds, e.g. different values of TgtA and TgtB could be applied for controlling different switching events. For instance, with separate carriers for controlling the switching on each side of the load, different values of TgtA and/or TgtB could be implemented in odd and even carrier cycles so as varying the relative timings of the +VDiff and −VDiff states, with the phase difference between the carriers providing common mode regulation. Alternatively, there may be a single carrier but different target values for controlling switching on each side of the load, with an offset between the target values (for a given state transition) being set depending on the desired shift in common mode, and possibly different target values for transitions to and from the +VDiff and −VDiff states for controlling the relative timings of the +VDiff and −VDiff states.

The controller 103 may thus be configured to receive the input signal Sin and generate one or more target threshold to be compared to first and second carriers signals for controlling switching of the first and second output nodes. The controller 103 may be configured to controllably modulate the phases of the first and second carriers signals so as to provide regulation of the voltage VDiff on the driver capacitor Cdiff, either to maintain this voltage at a substantially constant level or to dynamic vary the voltage according to operating parameters, and also to regulate the common mode voltage of the capacitor string.

Figure 6:
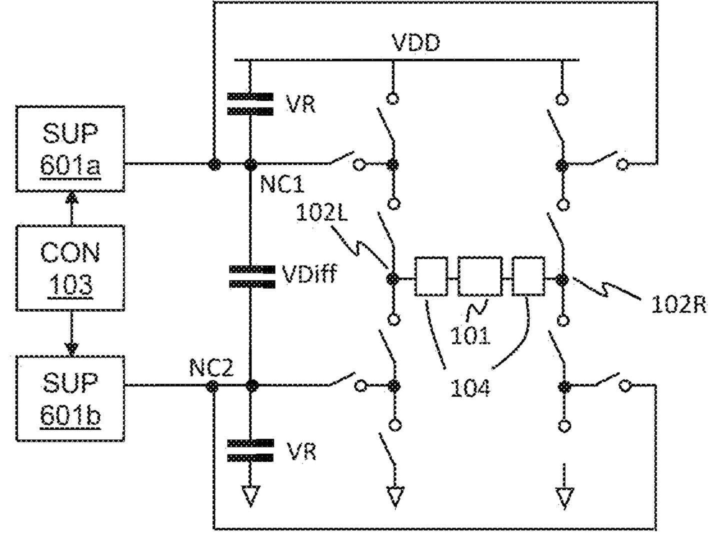
FIG. 6 illustrates another example of a switching driver with secondary supplies.

Embodiments of the present disclosure can thus provide regulation of the various voltages of the capacitor network or capacitor string, i.e. the voltages at the first and second capacitor nodes NC1 and NC2, and hence the common mode of these voltages and also the differential voltage VDiff defined by the driver capacitor CDiff, through appropriate choice of modulation pattern in operation and no external regulation is required. In some implementations, however, at least some regulation of the voltages of the capacitor network may be provided by some secondary supply arrangement, as illustrated in FIG. 6. FIG. 6 illustrates that each of the first and second capacitor nodes NC1 and NC2 may also be connected to a respective secondary supply 601*a* and 601*b*. Each of the secondary supplies 601*a* and 602*b* may be controllable, e.g. by the controller 103, to selectively generate a controlled regulation current for regulating the voltages at the first and second capacitor nodes NC1 and NC2, for instance to regulate the common-mode voltage of the capacitor string. The secondary supplies, may, for example, comprise current or voltage sources, for instances such as controlled current sources or a low-drop out regulator or the like. For regulation of the voltage VDiff of the driver capacitor CDiff, the secondary supplies 601*a* and 602*b* may be configured to provide equal and opposite regulation currents, so the charge drawn from one of the first and second capacitor nodes NC1 and NC2 is balanced by the charge supplied to the other of first and second capacitor nodes NC1 and NC2. For regulation of the common mode of the capacitor voltages at the first and second capacitor nodes NC1 and NC2, there may be a controlled imbalance in the regulation currents.

The controller 103 may be configured to selectively control the secondary supplies to supplement the regulation of the voltages in certain use cases, for instance, the secondary supplies could be operated periodically if the common-mode voltage of the capacitor string varies from a desired value by more than a threshold amount and/or if a relatively large change in the voltage VDiff of the driver capacitor CDiff is required. Thus, the secondary sources 601*a* and 602*b* may not be operated in a continuous manner in operation of the switching driver. The secondary sources 601*a* and 601*b* could additionally or alternatively be operated to supply energy to the capacitor string in a low-power mode of operation, as will be described in more detail below.

The discussion above has focused on a three or four event switching sequence that includes at least one instance of the +VDD or −VDD state in the sequence. Such a four-phase modulation mode (which is also referred as a four-level mode) could be used to provide the drive signal across the whole operating range of the switching driver. In some implementations, however, when the desired drive signal is within the range of +VDiff to the −VDiff, the switching driver may be configured to change to a two-level modulation mode which alternates between the +VDiff and −VDiff states. That is, if the respective desired average voltage at each of the first and second output nodes 102L and 102R is between the first and second switching voltages, e.g. between 27V and 21V in the example above, the switching driver may be configured to modulate each of the output nodes in a sequence that alternates between these switching voltages and does not include an instance of the first or second supply voltages in each switching cycle.

Operating in such a two-level modulation mode when possible, e.g. for low amplitude output signals, is beneficial as it allow a reduction in the level of the voltage modulation at the output nodes 102L and 102R compared to the three/four event sequence described above which includes modulating one of the output nodes to the supply voltage VDD for part of the switching sequence. This can result in a reduction in noise and yield an improvement in dynamic range, and/or reduce power loss or provide improvements in power efficiency.

In the two-level modulation mode, the switching driver 100 may be switched to the +VDiff state for a period TA in a switching cycle and then the rest of the period TB of the switching cycle (where TA+TB=TT) is spent in the −VDiff state. This two-level modulation mode of operation may be similar to conventional class-D modulation schemes and, as a result, can use conventional single carrier modulation in a similar manner as for conventional AD modulated signals.

The switching driver 100 may be configured to transition between different modulation modes, e.g. between the four-level modulation mode and the two-level modulation mode based on knowledge of the existence of a +VDiff or −VDiff state in the switching sequence in each mode of operation. The transition between modes can be aligned with an instance of the +VDiff or −VDiff state, so that on a transition in modulation mode the switching driver remains in the relevant +VDiff or −VDiff state, but with an altered timing corresponding to the modulation required to achieve the desired average output voltage in the new mode. In some cases, the transition may be controlled to occur at a point when the output current is, or is expected to be, substantially equal to the average of the output current waveform.

The transition can also be performed based on envelope tracking, based on the input signal Sin or the average output voltage. For example, for high level output drive voltage, the switching driver 100 may operate in the four-level modulation mode, while for low level drive voltages, with a magnitude lower than VDiff, the switching driver 100 may transition to the two-level mode. It will be understood, as described above, the voltage VDiff can be regulated when operating in the four-level mode to have any desired voltage and thus the maximum signal threshold for operation in the two-level mode may be dynamically varied by varying VDiff.

Figure 7:
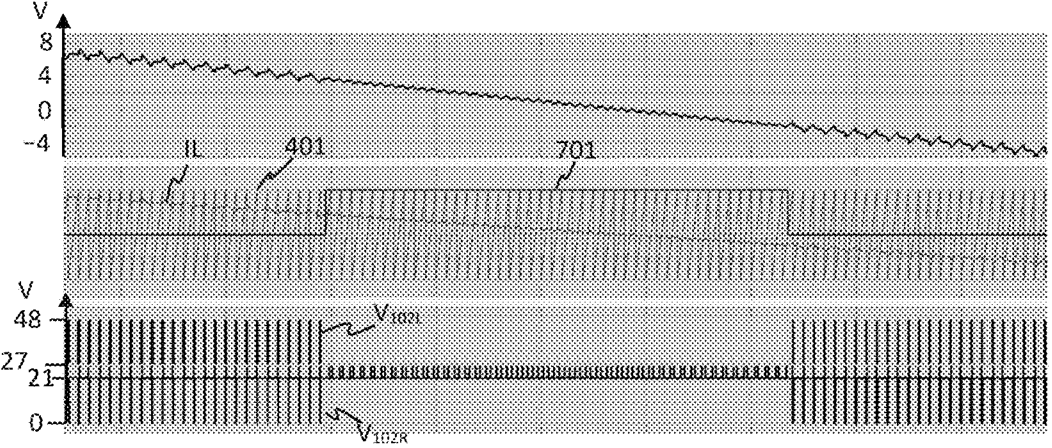
FIG. 7 illustrates switching waveforms for transition between four-level and two-level modulation modes.

FIG. 7 illustrates example waveforms for the switching driver when transitioning from the four-level mode to the two-level mode and then back to the four-level mode. The top panel of FIG. 7 illustrates the output of the switching driver and illustrates the variation due to the output current expressed in the voltage domain and thus is representative of the differential drive voltage. The example of FIG. 7 shows the differential starting at a voltage level slightly above the VDiff voltage of 6V and steadily becoming less positive/more negative over time. The second panel illustrates the output current IL and also illustrates the carrier 401 (in this example a single carrier for switching both the first and second output nodes 102L and 102R is illustrated for clarity). The lower panel illustrates the voltages $V_{102L}$ and $V_{102R}$ at the output nodes.

FIG. 7 illustrates that the switching driver 100 is initially operating in the four-level modulation modes described above with the first output node 102L being modulated in a sequence of +VDD, the first defined switching voltage, +VDD and the second defined switching voltage, so 48V, 27V, 48V, 21V in the examples described above, with the second output node 102R being modulated between ground, the second capacitor voltage, ground and the first capacitor voltage, so 0V, 21V, 0V, 27V in this example. The switching cycle period in the four-level mode is equal to twice the carrier period.

Once the value of the differential drive signal is sufficiently lower than +VDiff the switching driver swaps to the two-level mode of operation and a two-level control signal, illustrated in the middle panel as signal 701 is asserted. In the two-level mode of operation, the switching driver 100 now operates in a sequence where the first output node 102L is modulated between the first and second defined switching voltages, e.g. between 27V and 21V, whilst the second output node 102R is also modulated between the same voltages, e.g. between 21V and 27V. The same carrier may be used, with an appropriate adjustment to the target values TgtA and TgtB, and the switching cycle period in the two-level mode is now equal to the carrier cycle period.

FIG. 7 illustrates that the differential drive signal crosses zero and becomes increasing negative and before the magnitude of the differential drive signal exceeds VDiff the two-level mode signal 701 is de-asserted and the switching driver returns to four-level modulation, but as the differential drive signal is now negative, the first output node 102L will be modulated between ground and the first and second capacitor voltages, e.g. in the sequence 0V, 27V, 0V, 21V, whilst the second output node 102R will be modulated between VDD and the first and second defined switching voltages, e.g. in the sequence 48V, 21V, 48V, 27V.

It will be understood that whilst operating in the two-level modulation mode, the prior description of differential regulation of the CDiff voltage does not apply. In the two-level modulation mode as described, the output signal is driven directly from the driver capacitor CDiff and thus the energy for the output signal is obtained from the driver capacitor CDiff. The delivery of energy to the load and losses of the converter itself, e.g. resistive losses and the like, will result in a drain of the voltage of the driver capacitor and operation in the two-level mode. As a result, modulating the output nodes between just the first and second capacitor voltages will cause the voltage VDiff of the driver capacitor CDiff to reduce.

The switching driver 100 may thus be configured to splice an additional two-level modulation into the output waveform that obtains energy from the VDD supply. In a two-level energy transfer mode, the average output voltage over the switching cycle is created using the VDD supply for part of the switching cycle. In particular, a switching cycle period in a two-level modulation energy transfer mode may include an instance of the +VDD state for positive load current or the −VDD state for negative load currents, with the rest of the period being the −VDD state for positive load currents or the +VDD state for negative load currents.

Figure 8A:
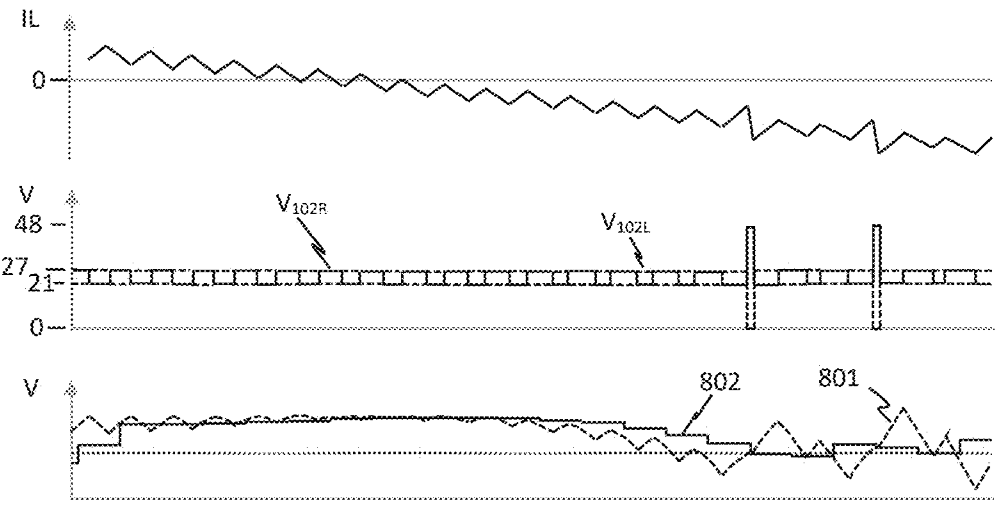
FIGS. 8*a* and 8*b* illustrate examples of two-level modulation with energy transfer.

An example of such a switching sequence is illustrated in FIG. 8*a*. As with the transition from four-level modulation to two-level modulation, the signal waveforms are spliced together to ensure that the same average charge packet (or same differential voltage) is delivered over a switching period.

FIG. 8*a* illustrates a transition from two-level modulation to two-level modulation with energy transfer. The first panel shows the output current IL. The second panel illustrates the voltages $V_{102L}$ and $V_{102R}$ at the first and second output nodes 102L and 102R. It can be seen that in the normal two-level modulation mode the first and second output nodes 102L and 102R are modulated between just the first and second defined switching voltages, e.g. between 27V and 21V. For energy transfer (for this example with a negative load current), one switching period includes an instance of the −VDD state where the first output node 102L is connected to ground, and the second output node 102R is connected to VDD, e.g. 48V. In the rest of that switching period the switching driver is controlled to the +VDD state. Over the switching period, the average signal is maintained to be equal even though the switching voltages are altered.

The third panel shows the voltage on the CDiff capacitor, as dotted line 801. It can be seen that, over time in operation in the normal two-level modulation mode, the voltage VDiff on the driver capacitor CDiff drops. However, following instance of the energy transfer periods, the capacitor voltage is restored. Such energy transfer sequences may therefore be spliced into two-level modulation to maintain the voltage VDiff as required. The controller 103 may thus be configured to receive an indication of the voltage VDiff and to operate with an energy transfer sequence when required. There are various ways in which capacitor voltage VDiff may be monitored to determine when to operate in an energy transfer sequence. For example, the lower panel of FIG. 8*a* also illustrates, as solid line 802, the measured average voltage over two sampled periods. In some implementations, if the average voltage measurement is less than a target voltage, energy is added to the system by operating with an energy transfer sequence.

Figure 8B:
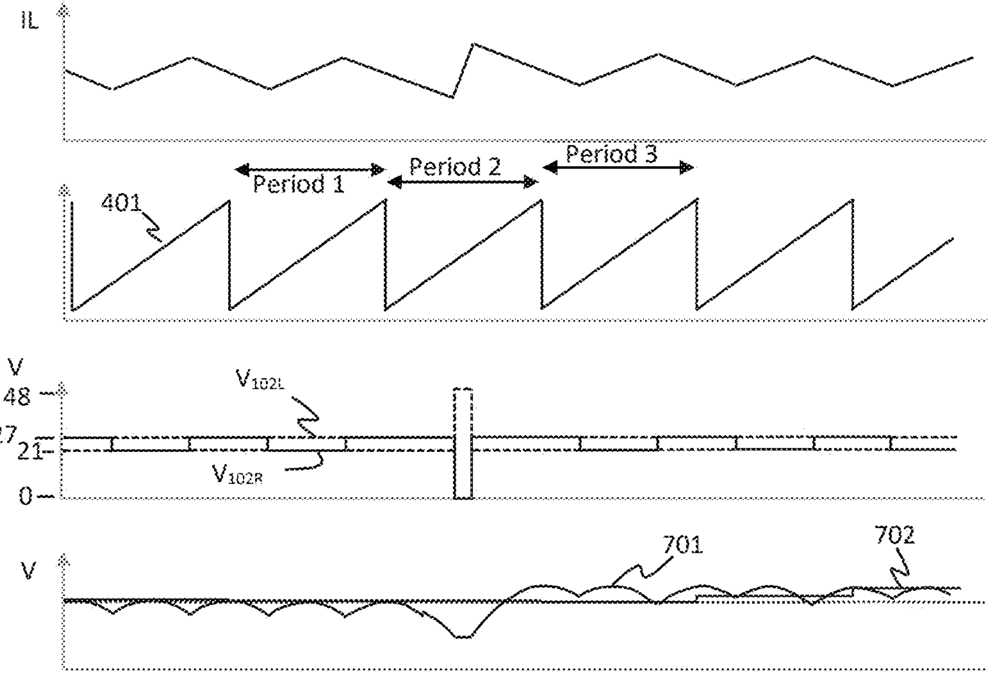

FIG. 8*b* illustrates an expanded view of an instance of an energy transfer sequence, this time for a positive load current, and also illustrates the carrier signal which defines the switching cycle period. FIG. 8*b* highlights three consecutive switching cycle periods. In period 1 and period 3 the desired output is generated from modulating each of the first and second output nodes 102L and 102R between the first and second defined switching voltages, e.g. between 27V and 21V. In period 2, with energy transfer, the output is generated by modulating the first output node 102L between VDD and the second defined switching voltage, e.g. between 48V and 21V, whilst the second output node 102R is modulated between ground and the first defined switching voltage, e.g. between 0V and 27V. The average voltage for period 1 is equal to period 2 is equal to period 3, even though period 2 includes a portion of energy transfer to the driver capacitor CDiff through application of the VDD supply voltage.

It should be noted that the energy transfer to the driver capacitor VDiff is via the inductor of the filter arrangement in the output path. The application of the VDD supply, in the plus +VDD state for a positive load current or via the −VDD state for a negative load current causes the magnitude of the load current in the output inductor to increase. This is then followed by operation in −VDiff state for a positive load current or the +VDiff state for a negative load current, which in each case results in charging of the driver capacitor CDiff, effectively using the energy stored in the inductor from the supply voltage.

Figure 9:
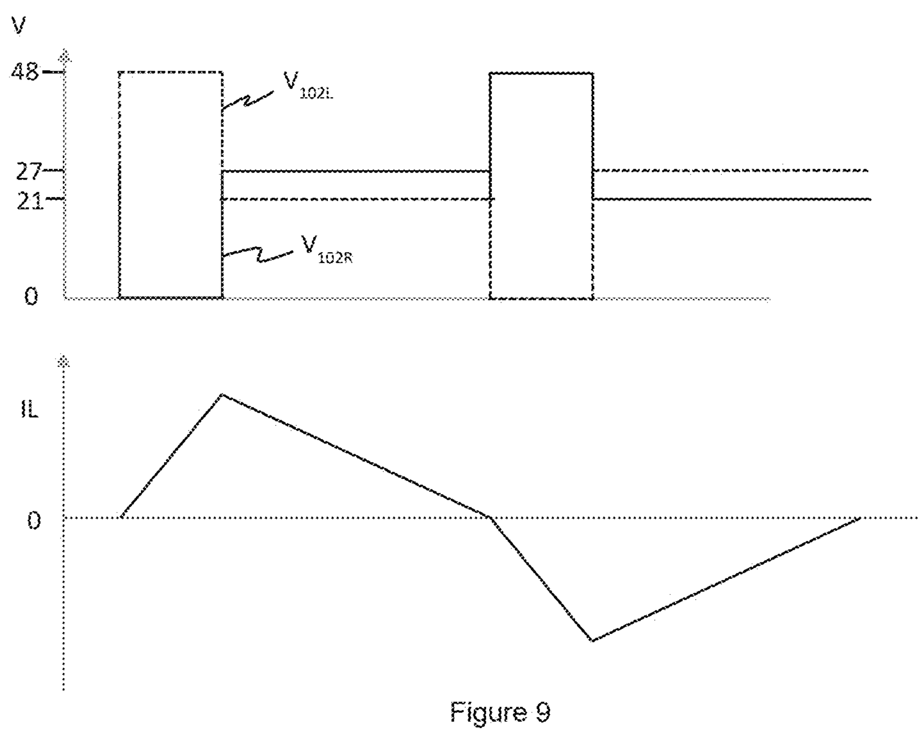
FIG. 9 illustrates example waveforms for energy transfer via the output inductor.

The filter inductor can be used for energy transfer to the driver capacitance even at very low or zero load current. FIG. 9 illustrates one example of a switching sequence that could transfer charge from the VDD supply to the driver capacitor CDiff via the inductor of the output filter whilst delivering zero current, on average over the course of the switching cycle, to the load. FIG. 9 illustrates the voltages $V_{102L}$ and $V_{102R}$ at the first and second output nodes 102L and 102R respectively and idealised current waveforms. FIG. 9 illustrates that the switching driver 100 may be switched to the +VDD state, with the first output node 102L connected to VDD and the second output node 102L connected to ground. This causes the output current IL through the inductors of the filter arrangement 104 to ramp up. The switching driver is then switched to the −VDiff state, with the first output node 102L connected to the second defined switching voltage and the second output node 102R connected to the first defined switching voltage. Assuming that for a zero-output current both side of the load are at the quiescent voltage level (of 24V in this example), this results in a negative voltage across the inductors and causes the output current to ramp down. It will be understood that the positive output current flowing in this state will charge the driver capacitor CDiff. The switching driver is then switched to the −VDiff state, which, in this example, results in a negative output current of increasing magnitude. The switching driver 100 is then switched to the +VDiff state, which results in the output current ramping up again. In this state, with a negative output current, the current charges the driver capacitor CDiff. If the periods of operation in the +VDD and −VDD states are equal to one another and the periods of operation in the +VDiff and −VDiff states are equal to one another, the average differential voltage will be zero and the average current delivered to the load can also be zero, but the driver capacitor CDiff can be kept charged. In general, therefore, by selection of an appropriate modulation pattern, i.e. by proper phasing of the different switch states, energy can be transferred from the VDD supply to the capacitor string, so as to keep the capacitor string charged appropriately, via the filter, without any significant load current, i.e. without resulting in any significant audio band current in the load for audio applications. In effect the inductor of the filter operates as a switch-mode power supply. This means of transferring energy from the primary supplies, e.g. from VDD, to the capacitor string represents another novel aspect of this disclosure.

The discussion with respect to FIGS. 8*a* and 8*b* and FIG. 9 is based on energy being transferred to the driver capacitor CDiff from the VDD supply. In some implementations, however, where there are secondary supplies 601*a* and 602*a* such as described with respect to FIG. 6, the secondary supplies could be used to provide energy to the driver capacitor CDiff when operating with two-level modulation. In this case, the switching driver may alternate between the +VDiff and −VDiff states as discussed above, and charge may be transferred from the secondary sources 601*a* and 601*b* to the capacitor string to maintain the correct voltages at the first and second capacitor nodes NC1 and NC2. As mentioned with respect to FIG. 6, the secondary sources 601*a* and 601*b* may be relatively simple sources, such as current sources or low-dropout regulators or the like, which may be powered from the VDD supply. In some use cases, using secondary sources to regulate the voltage VDiff on the driver capacitor CDiff may be more power efficient, for low amplitude output signals, than using the VDD supply to provide energy transfer in the two level modulation mode as discussed with respect to FIGS. 8*a* and 8*b*, as it avoids losses associated with operation of the high-power switches used to enable the +VDD or −VDD states, e.g. switches S1L and S1R.

The embodiment of FIG. 1 illustrate one particular implementation of a switching driver 100 but it will be understood that various alternatives could be implemented. For example, FIG. 10, illustrates another example of a switching driver 1000 that could be implemented, in which similar components are identified by similar labels.

Figure 10:
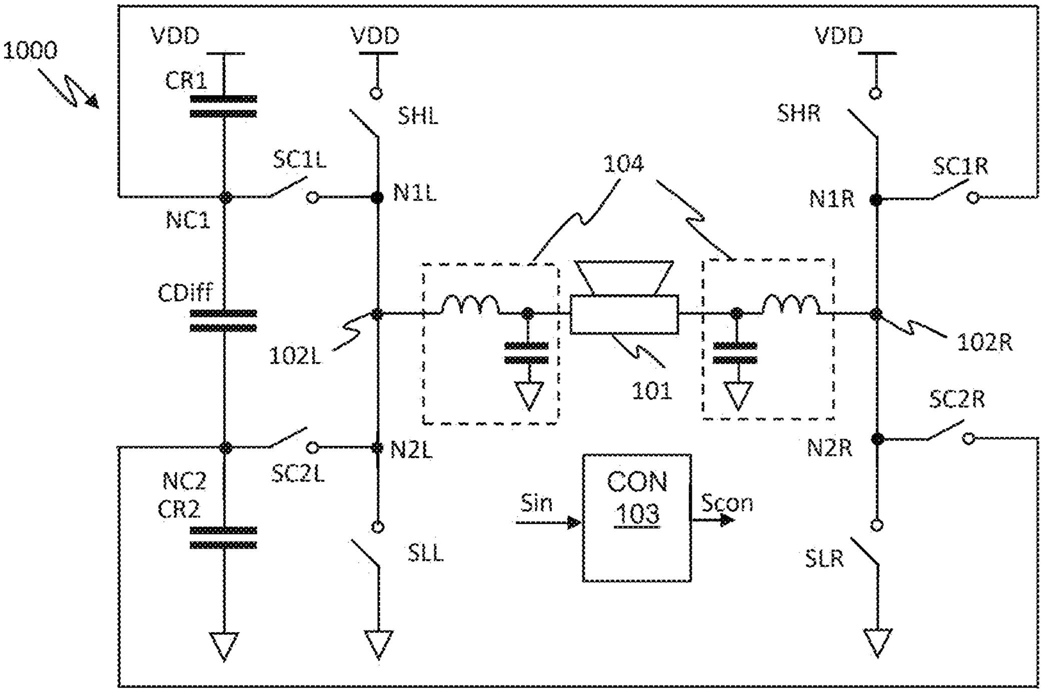
FIG. 10 illustrates another example of switching driver according to an embodiment for driving a load in a BTL configuration.

The switching driver 1000 again has first and second output nodes 102L and 102R which, in the example of FIG. 10, may be configured to drive a load 102 via filter arrangement 104 in a BTL configuration in a similar manner as discussed in the FIG. 1. The switching driver 1000 effectively omits the switches S2L, S3L, S2R and S3R from the structure of FIG. 1. Reducing the overall number of switches may be beneficial in terms of circuit area, cost and/or efficiency. Thus, the first output node 102L can be selectively coupled to each of the first and second supply voltages by switches SHL and SLL respectively, or to each of the first and second capacitor nodes NC1 and NC2 via switch SC1L and SC2L respectively. Similarly, the second output node 102R can be selectively connected to any of the first and second supply voltages, or the first and second capacitor nodes NC1 and NC2 via switches SHR, SLR, SC1R and SC2R respectively.

In some implementations all the switches may be implemented as part of the same integrated circuit (IC). In some applications one or more of capacitors of the capacitor strings may also be formed as part of the IC as an integrated capacitor. However, for at least some applications, for the size of the capacitors it may be preferable to use an external, i.e. off-chip, capacitor for at least one of the capacitors of the capacitor strings and thus an IC implementation may have suitable connections for the external capacitor(s) of the capacitor string. In some applications it may additionally be advantageous for at least some parts of the switching driver to be implemented as different ICs. For instance, the switches SHH, SLL, SHR and SLR discussed with reference to FIG. 10 may be implemented as part of an output stage IC which may be separate to an IC comprising the switches SC1L, SC2L, SC1R and SC2R and the capacitors/connections for the capacitors of the capacitor string. This may allow each IC to be tailored appropriately. For instance, the SHH, SLL, SHR and SLR may be implemented as relatively high-power devices, whereas for the switches SC1L, SC2L, SC1R and SC2R that provide connection to the nodes of the capacitors strings there may be advantages in using lower power devices for efficiency. In some cases, one of the ICs could be implemented uses a different material system than the other, e.g. GaAs or some other compound semiconductor system rather than single element silicon, and/or with different process nodes.

Figure 11:
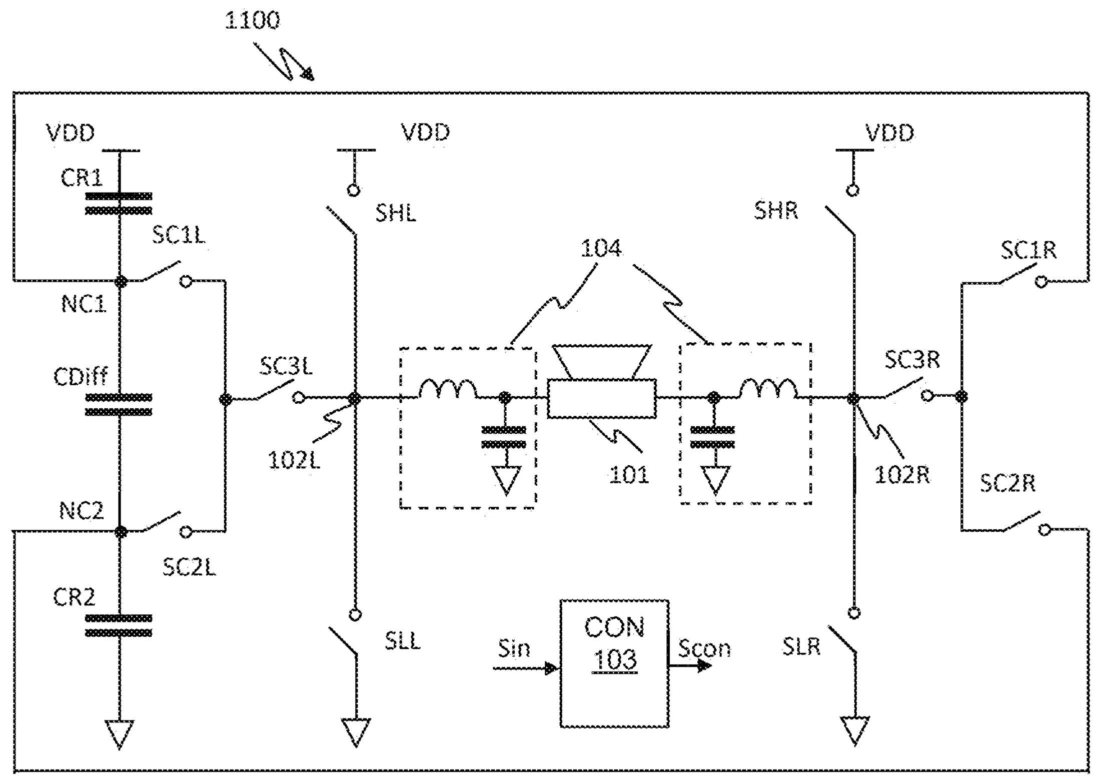
FIG. 11 illustrates a further example of switching driver according to an embodiment for driving a load in a BTL configuration.

FIG. 11 illustrates a further example of an alternative switching driver 1100 in which the switches SC1L and SC2L do not connect directly to the first output node 102L, but connect to a common node that can be connected to the first output node 102L via switch SC3L. Similarly switches SC1R and SC2R connect to the second output node 102R via switch SC3R. This increases the overall number of switches compared to the embodiment of FIG. 10, but this arrangement can be beneficial in some use cases with respect to the required voltage tolerance of some of the switches of the system, in particular switches SC1L, SC2L, SC1R and SC2R, and this may allow devices to be used with a lower drain-source voltage tolerance/breakdown voltage, than would otherwise be the case.

The examples of FIGS. 1, 6, 10 and 11 all illustrate switching drivers which use a capacitor string which includes a driver capacitor CDiff which is controlled to have a desired intermediate voltage and which thus provides first and second defined switching voltages which can be used for modulation of the first and second output nodes 102L and 102R.

In some examples, the capacitor string, i.e. the first and second defined switching voltages may be shared between multiple switching drivers, i.e. between multiple amplifiers, for instance between multiple audio amplifiers in a multichannel audio system. As noted above, the operation of an individual switching driver or amplifier can be controlled so as to regulate the intermediate voltage VDiff on the driver capacitor CDiff and thus keep it at a desired voltage, and likewise the first and second defined switching voltages. The driver capacitor voltage can thus also be used as a switching voltage for one or more other switching drivers, i.e. there may be a common capacitance, connected to a common capacitance node, which is used as a driver capacitor for each of a plurality of switching drivers.

Figure 12:
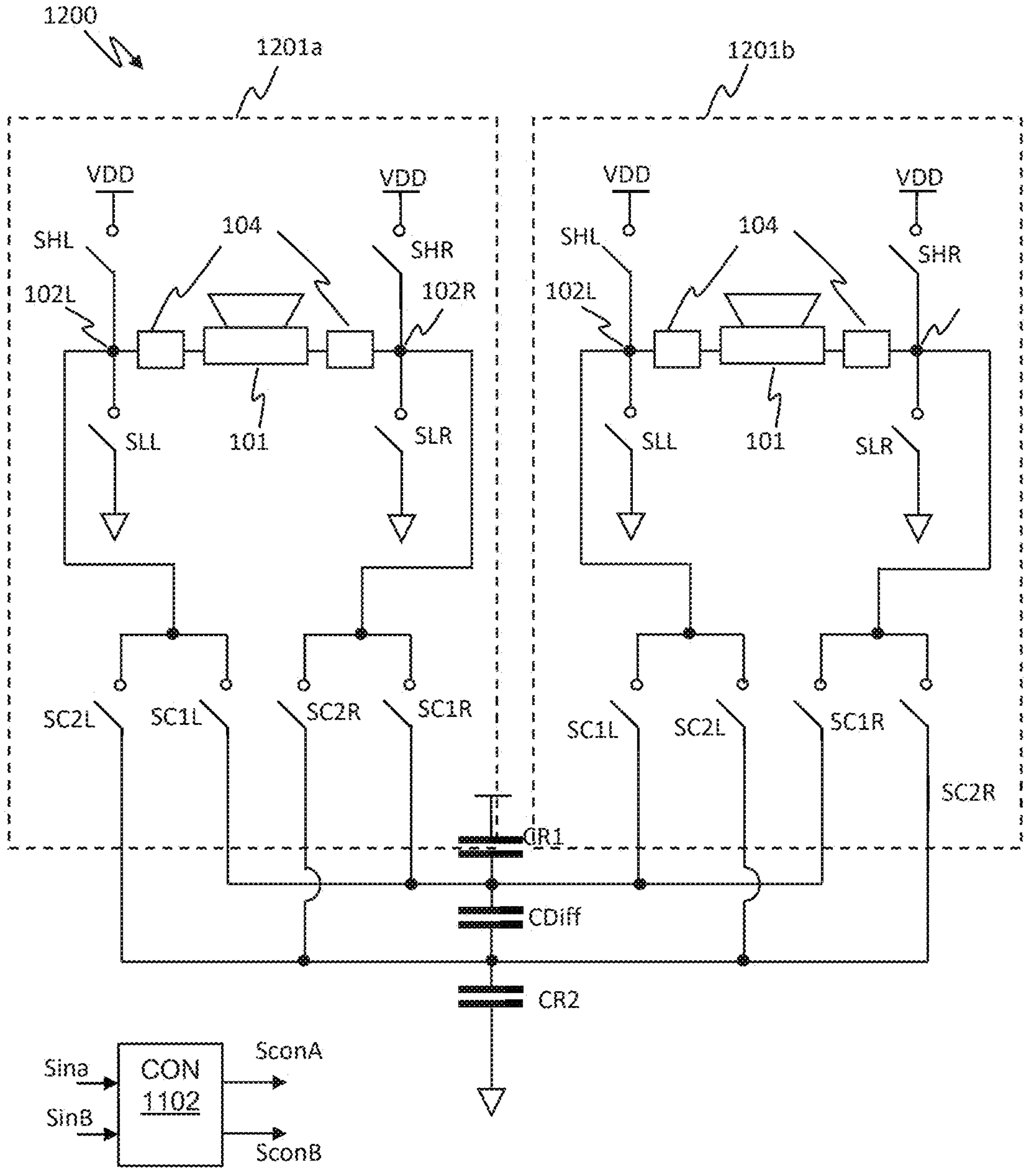
FIG. 12 illustrates an example with the capacitor string shared between multiple BTL drivers.

FIG. 12 illustrates an example of an amplifier system 1200 comprising multiple switching drivers which share a capacitor string. In the example of FIG. 12, there are two switching drivers, 1201*a* and 1201*b* but it will be understood there could be more in some applications. In the example of FIG. 12 each of the switching drivers 1201*a* and 1201*b* has the structure as discussed with respect to FIG. 11, but it will be understood that any of the embodiments discussed herein could be used as the switching drivers 1201*a* and 1202*a*.

Each switching driver 1201*a* and 1201*b* is thus connected to the first and second capacitor nodes NC1 and NC2 and may be operated as described above in a sequence of states which are controlled such that, over the course of the sequence, the total current drawn from the each of the first and second capacitor node NC1 and NC2 by that switching driver equals the total current supplied to the relevant capacitor node by that driver and thus operation of each switching driver provides charge balancing for the driver capacitor CDiff. Each switching driver 1201*a*, 1201*b* may thus be effectively operated in an independent manner based on the relevant input signal to drive its respective transducer.

In some implementations, the different switching drivers may be configured so as to try to minimize the variation in charge at each of the capacitor nodes. If both switching drivers 1201*a* and 1201*b* were to be operated in a state that resulted in the respective load current being drawn from the top plate of driver capacitor CDiff at the same time, there could be a relatively significant decrease in charge of the driver capacitor CDiff, with an associated droop in the capacitor voltage. Likewise, if both switching drivers 1201*a* and 1201*b* supplied current to the driver capacitor CDiff at the same time, there could be a relatively significant increase in charge of the driver capacitor CDiff. However, if one of the switching drivers 1201*a* and 1201*b* was operated in a state that supplied load current to the first capacitor node NC1 at the same time that the other switching driver was sourcing load current from the first capacitor node NC1, the change in charge of the driver capacitor CDiff would be a result of any difference in current and thus the variation in charge of the driver capacitor CDiff and resultant voltage ripple at this node would be reduced.

Thus, in at least some applications the operation of the switching drivers 1201*a* and 1201*b* may be arranged such that instances of a state that leads to switching driver 1201*a* drawing load current from the first capacitor node NC1/supply current to the second capacitor node NC2 is likely to occur at the same time as an instance of a state that leads to switching driver 1201*b* providing load current to the first capacitor node NC1/drawings current from the second capacitor node NC2. For instance, if the respective input signals SinA and SinB for the switching drivers 1201*a* and 1201*b* were the same as one another, then each instance of a state +VDiff or −VDiff for the switching driver 1201*a* could coincide with an instance of state −VDiff or +VDiff for the switching driver 1201*a* and vice versa. Where the operation in the sequence of states is controlled by comparison with different carrier waveforms, such as discussed with reference to FIG. 4, the same carriers could be used for each switching driver but with an appropriate phase shift for the carriers for the different switching drivers.

In some applications, a controller 1202 could control operation of all of the switching drivers 1201*a* and 1201*b* that share the capacitor string so as to control the switching drivers to drive their respective transducers based on the respective input signal, e.g. SinA or SinB, and to collectively operate the switching drivers in a selected sequence of states to provide charge balancing of the driver capacitor CDiff.

The embodiments discussed with reference to FIGS. 1, 6, 10, 11 and 12 show that the first and second output nodes 102L and 102R of the (or each in the case of FIG. 12) switching driver are connected on opposite sides of a load to drive that load in a BTL configuration. As described above, with controlled modulation of the voltages at each of these output nodes between the first and second supply voltages and the first and second defined switching voltages, the load can be driven with a differential drive signal in the range of +VDD to −VDD, and regulation of the voltages of the capacitor strings can be achieved within one or more switching cycles. Such BTL operation allows for good regulation of the voltages of the capacitor string due to the differential nature of operation, i.e. the current flowing out of one output node is matched to the current flowing into the other output node and any inaccuracies or losses can be managed by controlling the phasing of switching on each side of the load.

In some embodiments, however, a switching driver may be arranged to drive a load in a single-ended manner, either in addition to or as alternative to driving at least one load in a BTL configuration.

Figure 13:
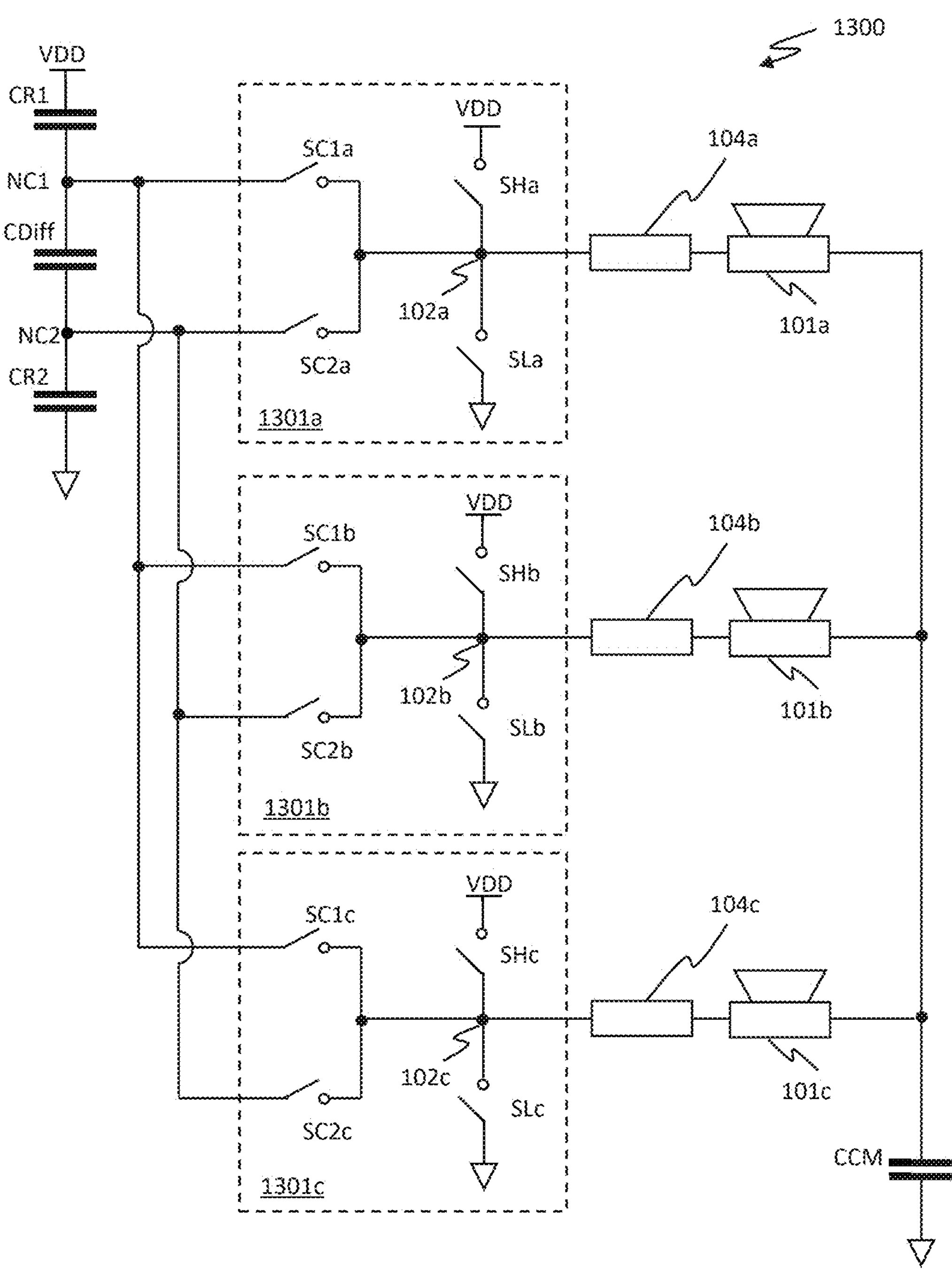
FIG. 13 illustrates an example of switching driver according to an embodiment for driving at least one load in a single-ended configuration.

FIG. 13 illustrates one example of a switching driver 1300 for driving a load in a single ended (SE) configuration. FIG. 13 illustrates that the switching driver 1300 comprises a capacitor string such as described previously and comprises a first SE driver stage 1301*a* with a first output node 102*a* configured for driving a first load 101*a* in SE configuration. As illustrated, there may be a first filter 104*a*, e.g. an LC filter, in the output path between the first output node 102*a* and the load 101*a*. The other side of the load 101*a* is connected to a defined common mode voltage, VCM, which for audio and similar applications would typically be a quiescent voltage level which is a midpoint voltage between the first and second supply voltages, e.g. to VDD/2. FIG. 13 illustrates that this voltage may be maintained by a common mode capacitor CCM.

In the example of FIG. 13, the SE driver stage comprises switches SHa and SLb for selectively connecting the output node to the first and second supply voltages respectively, e.g. VDD and ground, and switches SC1*a* and SC2*a* for selectively connecting the first output node 102*a* to the first and second defined switching voltages of the capacitor string respectively, i.e. to the voltages at node NC1 and NC2 of the capacitor string. In one example the first and second supply voltage could be, say 48V and ground, and the first and second defined switching voltages could be, say, nominally 30V and 18V respectively, with the voltage VDiff being nominally equal to 12V and the voltage on each reference capacitor being nominally equal to 18V.

In use the SE driver stage 1301*a* can be operated to modulate the voltage at the first output node to any of these voltages. To generate a positive output voltage and positive output current (which will be defined herein as a current flowing out of the first output node to the load 101 and a negative current will be the reverse) the SE driver stage 1301*a* may be operated in a modulation sequence that involves a first state in which the output node is connected to the first supply voltage, i.e. to VDD, a second state in the output node is connected to the first defined switching voltage and a third state in which the output node is connected to the second defined switching voltage. Assuming the far side of the load is maintained at VDD/2, the first results in a voltage difference of +VDD/2 across the output path, e.g. 24V in the example given, the second state results in a voltage difference of +VDiff/2 across the output path, e.g. 6V in the example given, and the third state results in a voltage difference of −VDiff/2 across the output path, e.g. −6V in the example given. The SE driver stage may be switched between these states to generate a desired drive voltage across the load on average over the switching cycle. For a negative output signal, the SE driver stage may be operated in a fourth state instead of the first state, where in the fourth state the first output node 102*a* is connected to the second supply voltage, e.g. ground to generate a voltage difference of −VDD/2 across the output path, e.g. −24V in this example.

For operation of the SE driver stage 1301*a* alone, any positive load current will discharge the capacitor string at node NC1 in the second state and will discharge the capacitor string at node NC1 in the third state, and a switching sequence as described above will thus result in a net loss of charge changing the DC values of the capacitor voltages. A negative load current would have the opposite effects in these states.

In this case, the charge on the driver capacitor CDiff may not be balanced over the course of an individual switching cycle, as discussed above, but instead may be regulated on the basis of the signal itself, e.g. over the course of a cycle of the signal. In some cases, this may involve modifying the switching cycle, i.e. modifying the signal, to try to ensure an average current of zero over a certain time period. The capacitors of the capacitor string may therefore be sized appropriately so as to be able to provide the expected amount of charge without undue voltage droop over the relevant time frame.

In some examples, however, as illustrated in the FIG. 13 the capacitor string may be shared with at least one additional SE driver stage. The example of FIG. 13 illustrates additional SE driver stages 1301*b* and 1301*c* each with a respective output node 102*b* and 102*b* for driving an associated load 101*b* and 101*c* via a respective filter 104*b* and 104*b*. Each of the loads 101*a*, 101*b*, and 102*c* is connected to a common node, which is coupled to the capacitor CCM.

A controller (not illustrated in FIG. 13) is configured to collectively control the switching of each of the SE driver stages so as to provide the required output drive voltage for each load and to also provide voltage regulation of the driver capacitance. In general, the switching of the SE driver stages is controlled so as to balance, as far as possible the charge drawn from each capacitor node so as to regulate the voltages of the capacitor string, e.g. the voltage VDiff of the driver capacitor Cdiff. The switching of the SE driver stages is also controlled, in this embodiment, so as to balance, as far as possible the charge drawn from the common mode capacitor CCM so as to regulate to the common mode voltage VCM for the different loads. In particular, two SE driver stages more could be arranged with reversed polarities of the loads such that a positive voltage and positive load current for at least one driver stage corresponds to a current flowing from the output node to the relevant load whereas a positive voltage and positive load current for at least one other driver stage corresponds to a current flowing from the relevant load into the output node. In this way common drive signals for the relevant loads would lead to current flow to the load in one SE driver stage and current flow from the load in another SE driver stage. In which case by appropriate choice of the switch states charge which is drawn from the capacitor string by one SE driver stage in one state may be replenished by current from another SE driver stage in another state and there may be limited change in charge on the common mode capacitor CCM.

Figure 14:
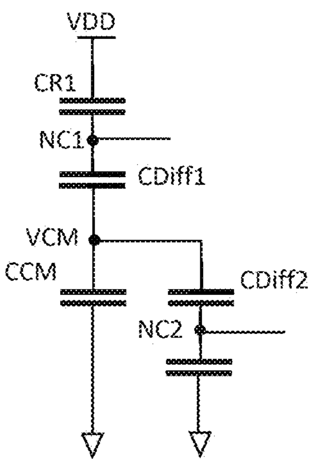
FIG. 14 illustrates examples of how a common-mode capacitance for the single-ended load may be incorporated into the capacitor string.
Figure 14:
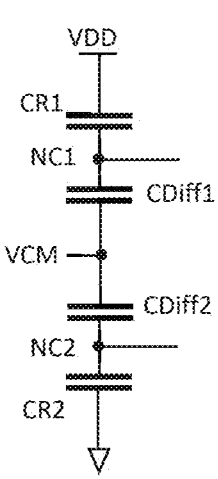

The example of FIG. 13 illustrated that the common mode voltage VCM may be maintained by a capacitor CCM which is separate to the capacitor string. However, in some cases it can be beneficial to have the common mode voltage defined as part of the capacitor string. FIG. 14 illustrates two examples of how the common mode voltage could be defined as part of the capacitor string. The left hand side of the FIG. 14 illustrates that the common mode voltage VCM could be maintained as a midpoint voltage of the capacitor string. In this case the capacitor CDiff is split into two capacitors, CDiff1 and CDiff2, each of which, in use will be charged to half the intermediate voltage, i.e. to VDiff/2, so that these two capacitances collectively define the intermediate voltage VDiff. The common mode capacitor CCM may then be connected to this midpoint node between CDiff1 and CDiff2. The right-hand side of FIG. 14 illustrates that in some embodiments, the common mode capacitor CCM may be omitted. Such arrangements can be beneficial in maintaining the common mode voltage of the capacitor string compared to the arrangement of FIG. 13, as any current drawn from one node of capacitor string by an SE driver will be supplied to the common mode node.

As described with respect to FIG. 6, in some cases some secondary sources, such as current sources, could be provided so as to controllably transfer charge to or from the capacitor string and/or common mode capacitance so as to regulate the relevant voltages.

The examples above have been described in the context of a switching driving which receive first and second voltages as a positive supply voltage and ground, but it will be understood that embodiments may be implemented with split-rail supplies, for instance with positive and negative supply voltages. The supply voltage, as used herein, refers to a voltage supply which is provided to the switching driver circuit. In some cases, there may be some upstream circuitry for processing a received voltage, e.g. a battery voltage or the like, to provide the supply voltage VDD for the switching driver, e.g. to apply some regulation and level shifting. It will be understood that the reference to any specific voltage level is by way of example only for the purposes of explanation and embodiments are not limited to the choice of any particular voltage.

The examples above have been discussed primarily in the context of driving an audio transducer, such as a loudspeaker, and embodiment may be implemented as audio switching drivers, i.e. as audio amplifiers. However, embodiments may be used to drive other types of transducers or electromagnetic loads, e.g. actuators, and are applicable to driving any load with a drive signal based on any received input signal.

The present disclosure thus provides a switching driver, i.e. an amplifier, for driving a load with an output signal based on an input signal. The amplifier is arranged to have access to a set of at least four different switching voltages and is arranged such that at least one output node for outputting the drive signal to the load can be modulated between selected ones of the set of switching voltages. At least two of the set of switching voltages are provided by capacitances. In use, a given average drive voltage may be generated by modulating the output node in a selected modulation pattern between selected ones of the set of switching voltages. There are multiple different modulation patterns that can be used to provide the desired average output voltage and the different modulation patterns provide different effects on other aspects of the amplifier operation, in particular use of the switching voltages provided by the capacitances may provide control over those voltages, either to provide regulation to a substantially constant nominal value or to vary the voltages in use, e.g. for efficiency. Different subsets of the switching voltages may be used for different operating conditions, e.g. for different output signal levels, e.g. for noise and/or efficiency benefits.

Example features of the proposed amplifier design can include:

A Bridge-Tied-Load (or BTL) amplifier creating an output while simultaneously regulating the differential and common mode voltage on a capacitor network for the purpose of creating multiple switching reference voltages.

Regulation of the differential voltage in the capacitor network, for example, via altering the duty cycle of the primary output signal.

Regulation of the common mode of the capacitor network, for example, by altering the phase.

Dynamically adjusting the number of switching voltages applied to the output based on the output signal, for example by using either: amplitude as the primary determiner of levels used; or altering the differential voltage based on the desired output.

Splicing the transitions between multiple n-level switching events to: optimize efficiency, minimize filtering, minimize ripple current, reduce power losses, reduce idle power losses, and/or reduce radiated Electromagnetic Interference (or EMI).

Obtaining energy from a supply voltage, e.g. 48V, when in a 2-Level mode.

Splicing the various 2-Level modes while maintaining equivalent average voltage/current settings.

Creation of 2-Level mode via an LDO regulator when output amplitude is low. This can be accomplished using LDOs and/or resistive methods.

Movement of common mode as a function of amplitude. For example, with low output voltage signals, the common mode can be adjusted towards either 0 (ground) or VDD to improve efficiency.

Sharing of the capacitor string with multiple amplifiers. For example, the regulation of common mode and differential voltages by one or more amplifiers/converters.

Aspects of the system may be defined by the following numbered statements.

S1A. A switching driver circuit for driving a load comprising:
- first and second output nodes for outputting a differential drive signal for driving the load;
- a driver switch network operable in a plurality of different switch states, the switch states comprising at least:
  - a first switch state wherein the first output node is connected to a first switching voltage and the second output node is connected to a second switching voltage;
  - a second switch state wherein the first output node is connected to the second switching voltage and the second output node is connected to the first switching voltage;

a third switch state wherein the first output node is connected to a first terminal of a driver capacitance and the second output node is connected to a second terminal of the driver capacitance, the driver capacitance providing an intermediate voltage across the first and second terminals of the driver capacitance;

a fourth switch state wherein the first output node is connected to the second terminal of the driver capacitance and the second output node is connected to the first terminal of the driver capacitance, and a controller configured to control the driver switch network to operate in a sequence of said switch states to generate said differential drive signal based on an input signal;

wherein the controller is configured such that operation of driver switch network in said sequence of switch states to generate said differential drive signal provides voltage regulation of the intermediate voltage provided by said driver capacitance.

S1B. A multi-level switching driver circuit for generating an output voltage at an output node based on a received input signal, the multi-level switching driver circuit comprising:

first and second supply nodes for receiving first and second supply voltages;

first and second intermediate voltage nodes for connection, in use, to an intermediate voltage, for example to first and second terminals of a driver capacitor providing the intermediate voltage;

a switch network comprising a plurality of switches configured to selectively connect the output node with a respective one of the first supply node, the second supply node, the first intermediate voltage node, or the second intermediate voltage node;

a controller for operating the switch network in a plurality of switch states to generate the output voltage, wherein the operation of the switch network in the plurality of switch states acts to regulate the intermediate voltage across the first and second intermediate voltage nodes.

S1C. A multi-level switching driver comprising:

a switch network configured to selectively connect an output node with a first supply voltage, a second supply voltage, a positive terminal of an intermediate voltage, and a negative terminal of the intermediate voltage, the intermediate voltage isolated from the first and second supply voltages, and a controller for controlling the operation of the switch network to generate an output voltage at the output node, wherein the operation of the switch network further acts to regulate the level of the intermediate voltage, and wherein the controller is further configured to adjust the operation of the switch network during generation of the output voltage to adjust the level of the intermediate voltage.

S1D. A multi-level switching driver circuit for driving a load connected between first and second output nodes with a differential drive signal, the multi-level switching driver circuit comprising:

first and second supply nodes for receiving first and second supply voltages;

first and second capacitor nodes for connection, in use, to a driver capacitor;

a network of switches configured to selectively connect each of the first and second output nodes to a respective one of the first supply node, the second supply node, the first capacitor node, or the second capacitor node; and a controller for controlling the network of switches in a sequence of switch states to generate said differential drive signal, wherein operation of driver switch network in said sequence of switch states to generate said differential drive signal provides charge balancing of the driver capacitor.

S1E. A driver system for driving a primary load terminal and at least one secondary load terminal, the driver system comprising:

a primary switching driver circuit to drive a primary load terminal, the primary switching driver circuit comprising:

a primary switch network coupled with one or more supply voltages and operable in a plurality of switch states; and a driver capacitor to provide an intermediate voltage, wherein the primary switching driver circuit generates an output voltage for driving the primary load terminal based on the selected switch states and the coupled supply and intermediate voltages, the driver system further comprising:

at least one secondary switching driver circuit to drive at least one secondary load terminal, the secondary switching driver circuit comprising:

a secondary switch network coupled with one or more supply voltages and operable in a plurality of switch states, wherein the secondary switch network is further coupled with the driver capacitor of the primary switching driver circuit, such that the intermediate voltage is provided to the secondary switching circuit, and wherein the secondary switching driver circuit generates an output voltage for driving the secondary load terminal based on the selected switch states and the coupled supply and intermediate voltages, wherein the switching of the primary switching driver circuit and the at least one secondary switching driver circuit is controlled to regulate the level of the intermediate voltage.

The primary load terminal and the secondary load terminal may be connected across a single load to provide a differential drive signal to the load (e.g. in a Bridge-Tied Load configuration), or alternatively the primary load terminal and the secondary load terminal may be connected to drive separate first and second loads, e.g. a primary speaker and a secondary speaker.

S1F. A driver system for driving a load, comprising:

a switching driver circuit coupled with at least one supply voltage and first and second output nodes; and an intermediate voltage isolated from the supply voltage, the intermediate voltage provided to the switching driver circuit, wherein the switching driver circuit is switched to generate a differential drive signal at the first and second output nodes for driving the load, based on the supply voltage and the intermediate voltage, and wherein the switching of the switching driver circuit acts to regulate the level of the intermediate voltage.

S1G. A driver system for driving at least two separate loads (e.g. two separate audio speakers), the driver system comprising:

at least two separate switching driver circuits coupled with at least one supply voltage; and an intermediate voltage isolated from the supply voltage, the intermediate voltage provided to the separate switching driver circuits, wherein the separate switching driver circuits are switched to generate separate output voltages to drive separate loads, based on the supply voltage and the intermediate voltage, and wherein the switching of the separate switching driver circuits acts to regulate the level of the intermediate voltage.

S1H. A driver system for driving at least two separate load terminals, the driver system comprising:

at least two separate switching driver circuits coupled with at least one supply voltage; and an intermediate voltage isolated from the supply voltage, the intermediate voltage provided to the separate switching driver circuits, wherein the separate switching driver circuits are switched to generate separate output voltages to drive separate load terminals, based on the supply voltage and the intermediate voltage, and wherein the switching of the separate switching driver circuits acts to regulate the level of the intermediate voltage.

S1I. A driver system for driving a load, comprising:

a switching driver circuit coupled with a first supply voltage, a second supply voltage, and at least a first output node; and an intermediate voltage isolated from the supply voltages, the intermediate voltage provided to the switching driver circuit, wherein the switching driver circuit is switched to generate a drive signal at the first output node for driving the load, based on the first and second supply voltages and the intermediate voltage, and wherein the driver system is operable in at least two of the following first and second modes of operation:

when in a first mode, the drive signal is generated based on the first supply voltage, the second supply voltage, and the intermediate voltage, and when in a second mode, the drive signal is generated based on the intermediate voltage and one of the first and second supply voltages, and when in a third mode, the drive signal is generated based on just the intermediate voltage.

Preferably, the switching of the switching driver circuit acts to regulate the level of the intermediate voltage.

Preferably, when in the first mode the driver signal is generated based on switching between four discrete voltage levels, and when in the second mode the driver signal is generated based on switching between two discrete voltage levels.

The intermediate voltage is provided as the voltage across a capacitor. Alternatively, the intermediate voltage is provided from discrete voltage sources.

S1J. A switching driver circuit for driving a load, comprising:

a switch network; and a capacitor string coupled between upper and lower supply voltages, the capacitor string comprising a first reference capacitor, a driver capacitor, and a second reference capacitor, the first reference capacitor connected between the upper supply voltage and a first terminal of the driver capacitor, the second reference capacitor connected between a second terminal of the driver capacitor and the lower supply voltage, wherein the switch network is coupled with the upper and lower supply voltages and with the first and second terminals of the driver capacitor, wherein the switch network is switched to generate an output voltage for driving a load based on the upper and lower supply voltages and the voltage across the driver capacitor.

Preferably, the driver capacitor has a greater capacitance level than the first and second reference capacitors.

Preferably, a controller is further configured to dynamically adjust the level of the intermediate voltage during operation of the switch network, by control of the switch states of the switch network.

S2. Preferably, a controller adjusts the level of the intermediate voltage by adjustment of the switch states of the switch network to increase or decrease the charge level applied to a driver capacitor providing the intermediate voltage. By adjusting the level of the intermediate voltage, overall system efficiency may be improved and/or the system switching noise may be reduced.

S3. Preferably, the controller is configured to dynamically adjust the level of the intermediate voltage based on one or more of the following:

a received input signal;

a generated output voltage;

a load current provided at the output node;

an output power level;

a switching frequency of the switch states of the switch network; and/or a system configuration (e.g. the system can be configured to operate in a relatively low-power low-performance mode, or in a relatively high-power high-performance mode).

S4. Preferably, the switching driver circuit is configured to monitor the load current at the output terminal, wherein the switching of the switch network is controlled based on the monitored load current and the desired output voltage to regulate the intermediate voltage.

S5. The switching driver circuit, wherein the first switching voltage comprises a first supply voltage, for example a positive supply voltage. Preferably, the second switching voltage comprises a second supply voltage, for example a negative supply voltage or a ground reference voltage.

S6. Preferably, the controller is configured to adjust the selection of and the duration of switch states in the sequence based at least in part on the differential drive signal to be generated and the voltage regulation to be provided.

S7. The switching driver circuit, wherein the driver capacitance is provided as part of a capacitor string arranged between the first switching voltage and the second switching voltage.

S8. Preferably, the capacitor string comprises a first reference capacitor connected in series between the first switching voltage and the first terminal of the driver capacitor, and a second reference capacitor connected in series between the second terminal of the driver capacitor and the second switching voltage.

Differential Regulation

S9. Preferably, the controller is configured to control the duration of at least two switch states of the sequence to regulate charge on the drive capacitor. In differential regulation mode, both terminals of the driver capacitor are connected to the load terminals, wherein charge is removed differentially from the driver capacitor and the reference capacitors.

Common Mode Regulation

S10. Preferably, the controller is configured to modulate a transition between switch states of the sequence to regulate charge on the drive capacitor and/or on capacitors of the capacitor string. In common mode regulation mode, only one terminal of the capacitor string is connected to one terminal of the load, wherein charge is either added/removed from the driver capacitor and the first or second reference capacitor, or charge is added/removed from a reference capacitor of the capacitor string.

S11. Preferably, the controller is configured to introduce an offset, preferably a phase offset, in control signals for individual switches of the driver switch network. It will be understood that the offset is introduced to generate a relative bias between a relatively high voltage side and a relatively low voltage side, such that charge is delivered from a first supply voltage to one of the terminals of the driver capacitor, or charge is added/removed from a reference capacitor of a capacitor string.

For example, a phase offset may be introduced on one edge of a carrier signal, such that the switch network spends proportionally more time in one switch state than another switch state.

S12. Preferably, the controller generates a first carrier signal to control switching of a first set of switches of the driver switch network, and a second carrier signal to control switching of a second set of switches of the driver switch network, wherein the controller is configured to control a phase shift between the first and second carrier signals to perform voltage regulation of the drive capacitor and/or of capacitors of the capacitor string.

S13. Alternatively, the controller generates a first carrier signal to control switching of the switches of the switch network, wherein the controller applies a gain control to adjust the target (or carrier) by the difference in the voltages.

S14. Preferably, the switching driver circuit is operable in at least two modes:

- a first mode wherein the driver switch network switches between the third switch state, the fourth switch state, and at least one of the first and second switch states; and
- a second mode wherein the driver switch network switches between the third switch state and the fourth switch state.

S15. Preferably, the switching driver circuit transitions to the second mode when the input signal or the differential drive signal is below a threshold level.

S16. Preferably, the switching driver circuit is controlled such that the transition between modes is performed when the driver switch network is in the third or fourth switch state.

Splicing of Additional Switch State, to Regulate Charge when in Two-Level Mode

S17. Preferably, when in the second mode of operation, the controller is configured to control the driver switch network to splice a further switch state into the second mode of operation, for regulation of voltage on the driver capacitor during the second mode.

S18. Preferably the spliced switch state is selected from either the first switch state or the second switch state.

S19. Preferably, the duration of the spliced switch state is controlled such that the average voltage across the switching cycle of the second mode when the spliced switch state is introduced is substantially equivalent to the average voltage across the switching cycle of the second mode without the spliced switch state.

S20. For any of the above systems, the driver switch network is controlled to splice a charge regulator switch state into the operation of the switch network, for regulation of voltage on the driver capacitor.

S21. Preferably, the duration of the spliced charge regulator switch state is controlled such that the average voltage across a switching cycle of the switch network when the spliced charge regulator switch state is introduced is substantially equivalent to the average voltage across the switching cycle of the switch network without the spliced switch state.

S22. With reference to above statement 11, the driver switch network is controlled to splice between any two of the three modes of operation such that the average charge delivered to the load across a switching cycle of the switch network when the spliced mode is introduced is substantially equivalent to the average charge delivered to the load across a switching cycle of the switch network when the spliced mode is not introduced.

S23. There is further provided an integrated circuit (or IC) comprising the driver circuit or driver system as described above, preferably an audio amplifier IC for driving a loudspeaker load.

S24. There is further provided a host device comprising the driver circuit or driver system as described above, the host device provided as a portable and/or battery powered host device, a domestic appliance or a vehicle.

Embodiments may be implemented as an integrated circuit. Embodiments may be implemented in a host device, which may be a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote-control device, a home automation controller or a domestic appliance, a toy, a machine such as a robot, an audio player, a video player. It will be understood that embodiments may be implemented as part of a system provided in a home appliance or in a vehicle. There is further provided a host device incorporating the above-described embodiments.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A switching driver control circuit for controlling a switching driver to drive a load with a drive signal based on an input signal comprising:

a controller configured to control modulation of at least a first driver output node of the switching driver between selected switching voltages of a set of at least four different switching voltages according to a switching pattern to generate said drive signal;

wherein the controller is configured such that for a given level of drive signal the controller can selectively operate with a plurality of different switching patterns and the controller is configured to select a switching pattern from said plurality of different switching patterns for operation to control at least one parameter of the switching driver other than a drive voltage of the drive signal.

2. The switching driver control circuit of claim 1 wherein said set of at least four different switching voltages comprises at least first and second switching voltages which are provided by a capacitor network and the at least one parameter of the switching driver comprises the values of said first and second switching voltages.

3. The switching driver control circuit of claim 2 wherein the switching driver is configured to drive the load in a bridge-tied-load configuration between the first driver output node and a second driver output node, and the controller is further configured control modulation of the second driver output node between selected switching voltages of said set of at least four different switching voltages according to said switching pattern to generate said drive signal.

4. The switching driver control circuit of claim 3 wherein the at least one parameter of the switching driver comprises a voltage differential between the first and second switching voltages and the controller is configured to control a duty cycle of modulation of each of the first and second driver output nodes to generate said drive signal and to control said voltage differential.

5. The switching driver control circuit of claim 3 wherein the at least one parameter of the switching driver comprises a common mode voltage of the first and second switching voltages and the controller is configured to control a relative timing of a transition in voltage of the first output node compared to a transition in voltage of the second output node to regulate the common mode voltage.

6. The switching driver control circuit of claim 5 wherein the controller is configured to control the transition in voltage of the first and second output nodes based on respective first and second carrier signals and wherein the controller is configured to control the relative phase of the first and second carrier signals to control said relative timing of the transition in voltage connection of the first and second output nodes.

7. The switching driver control circuit of claim 5 wherein the controller is configured to control the transition in voltage of the first and second output nodes based on comparison of a carrier signal against respective first and second threshold values and wherein the controller is configured to control any offset between the first and second threshold values to control said relative timing of the transition in voltage connection of the first and second output nodes.

8. The switching driver control circuit of claim 3 wherein said set of at least four different switching voltages comprises:

first and second switching voltages which are provided by respective first and second capacitor nodes of the capacitor network which, in use, is connected between first and second supply voltages and comprises a driver capacitance coupled between the first and second capacitor nodes; and said first and second supply voltages.

9. The switching driver control circuit of claim 8 wherein said capacitor network further comprises a first reference capacitance connected between the first supply voltage and the first capacitor node and a second reference capacitance connected between the second capacitor node and the second supply voltage.

10. The switching driver control circuit of claim 8 wherein the controller is configured to control the first switching driver to selectively operate in any of:

a first state in which the first output node is connected to the first supply voltage and the second output node is connected to the second supply voltage;

a second state in which the first output node is connected to the first switching voltage and the second output node is connected to the second switching voltage;

a third state in which the first output node is connected to the second switching voltage and the second output node is connected to the first switching voltage; and a fourth state in which the first output node is connected to the second supply voltage and the second output node is connected to the first supply voltage;

wherein operation in said states is controlled in accordance with the selected switching pattern.

11. The switching driver control circuit of claim 10 wherein the controller is configured to be operable in a first mode of operation, in which:

for a drive signal of one polarity the switching driver is operated in a switching cycle that includes at least one instance of each of the first, second and third states and for a drive signal of an opposite polarity the switching driver is operated in a switching cycle that includes at least one instance of each of the fourth, second and third states;

wherein, in the first mode of operation, the controller is configured to control the relative duration of the instances of the second and third states in the switching cycle to regulate an intermediate voltage of said driver capacitance.

12. The switching driver control circuit of claim 11 wherein the controller is configured to regulate said intermediate voltage of said driver capacitance so as to dynamically vary a value of the intermediate voltage based on at least one operating parameter of the switching driver.

13. The switching driver control circuit of claim 11 wherein the controller is further configured to be operable in a second mode of operation, for drive signals with a magnitude less than the intermediate voltage of said driver capacitance, in which:

the switching driver is operated in a switching cycle that includes at least one instance of each of the second and third states and does not include any instances of the first or fourth states.

14. The switching driver control circuit of claim 13 wherein, the controller is further configured to be operable in a third mode of operation, for drive signals with a magnitude less than the intermediate voltage of said driver capacitance, in which:

for a drive signal of one polarity the switching driver is operated in a switching cycle that alternates between operation in the first state and the third state and for a drive signal of the opposite polarity the switching driver is operated in a switching cycle that alternates between the fourth state and the second state; and wherein the controller is configured to intersperse operation in one or more switching cycles in the second mode of operation with operation in a switching cycle in the third mode of operation to maintain the intermediate voltage of said driver capacitance.

15. The switching driver control circuit of claim 14 wherein the switching driver is configured, in use, to drive the load via a filter arrangement comprising a series inductor in an output path between the first and second driver output nodes, and wherein operation in the third mode is configured to transfer energy derived from one of the first and second supply voltages to the driver capacitance via the inductor of the filter arrangement.

16. The switching driver control circuit of claim 3 wherein the switching driver is configured, in use, to drive the load via a filter arrangement comprising a series inductor in an output path between the first and second driver output nodes, and wherein the switching driver is operable, in one mode of operation, to select a switching pattern from said plurality of different switching patterns that:

transfers energy derived from one of the first and second supply voltages to the inductor of the filter arrangement and transfers energy from the inductor of the filter arrangement to the driver capacitance without resulting in any significant load current in a signal band for the drive signal.

17. The switching driver control circuit of claim 3, wherein:

said switching driver is one of a plurality of switching drivers configured to drive respective loads in a bridge-tide load configuration by modulating a pair of output nodes between selected switching voltages of said set of at least four different switching voltages including said first and second switching voltages which are provided by the capacitor network; and the controller is configured to control a respective switching pattern for each of the plurality of switching drivers to generate a respective drive signal and to control the values of said first and second switching voltages.

18. The switching driver control circuit of claim 17 wherein the controller is configured to control the respective switching pattern for each of the plurality of switching drivers based on an indication of which of the plurality of switching drivers is drawing current from or supplying current to the capacitor network.

19. The switching driver control circuit of claim 3 further comprising at least one current or voltage source configured to transfer charge to or from the capacitor network, wherein the controller is further configured, in at least one mode of operation, to control said at least one current or voltage source to control at least one of a common mode voltage of the capacitor network and a voltage differential between the first and second switching voltages.

20. The switching driver control circuit of claim 2 wherein the switching driver is configured to drive the load in a single-manner configuration, with the load coupled between the first driver output node and a DC voltage node.

21. The switching driver control circuit of claim 20 wherein a DC voltage at the DC voltage node is maintained by a common-mode capacitance that forms part of the capacitor network.

22. The switching driver control circuit of claim 20 wherein the switching driver further comprises at least one additional driver output node configured to driver at least one additional load with a respective drive signal, each additional load being coupled between the relevant additional driver output node and the DC voltage node; and wherein the controller is configured to control modulation of each additional output node of the switching driver between selected switching voltages of said set of at least four different switching voltages according to a respective switching pattern to generate the respective drive signal; and wherein the controller is configured to select a respective switching pattern for each of the first driver output node and additional driver output nodes to control the values of said first and second switching voltages.

23. The switching driver control circuit of claim 1 wherein the set of at least four different switching voltages are not evenly spaced from one another.

24. A switching driver comprises the switching driver control circuit of claim 1 and a network of switches for selectively connecting the at least first driver output node to any of the set of the four different switching voltages.

25. A switching driver circuit for driving a load comprising:

first and second driver output nodes for outputting a differential drive signal for driving the load;

a driver switch network operable in a plurality of different switch states, the switch states comprising:

a first switch state wherein the first output node is connected to a first switching voltage and the second output node is connected to a second switching voltage;

a second switch state wherein the first output node is connected to the second switching voltage and the second output node is connected to the first switching voltage;

a third switch state wherein the first output node is connected to a first terminal of a driver capacitance and the second output node is connected to a second terminal of the driver capacitance, the driver capacitance providing an intermediate voltage across the first and second terminals of the driver capacitance;

a fourth switch state wherein the first output node is connected to the second terminal of the driver capacitance and the second output node is connected to the first terminal of the driver capacitance, and a controller configured to control the driver switch network to operate in a sequence of said switch states to generate said differential drive signal based on an input signal;

wherein the controller is configured such that operation of driver switch network in said sequence of switch states to generate said differential drive signal provides voltage regulation of the intermediate voltage provided by said driver capacitance.

26. A switching driver circuit for controlling a switching driver to drive a load with a drive signal based on an input signal comprising:

a capacitor network comprising a plurality of capacitors connected between first and second supply voltages to define a different first and second switching voltages at respective first and second capacitor nodes; and a controller configured to control sequencing of connection of each of first and second driver output nodes to any of a set of switching voltages including said first and second different switching voltages to generate the drive signal;

wherein the controller is configured to control said sequencing so as to generate the drive signal and also provide voltage regulation of the first and second switching voltages at the respective first and second capacitor nodes.

* * * * *